US012003251B2

(12) United States Patent
Moctezuma et al.

(10) Patent No.: US 12,003,251 B2
(45) Date of Patent: Jun. 4, 2024

(54) INDUCTIVE CURRENT DIGITAL-TO-ANALOG CONVERTER (DAC) AND RELATED CONTROL OPTIONS

(71) Applicant: TEXAS INSTRUMENTS INCORPORATED, Dallas, TX (US)

(72) Inventors: Ariel D. Moctezuma, Richardson, TX (US); Marius Dina, Inver Grove Heights, MN (US); William R. Krenik, Garland, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/703,300

(22) Filed: Mar. 24, 2022

(65) Prior Publication Data

US 2022/0376699 A1 Nov. 24, 2022

Related U.S. Application Data

(60) Provisional application No. 63/191,382, filed on May 21, 2021.

(51) Int. Cl.
*H03M 1/74* (2006.01)
*H03M 1/66* (2006.01)

(52) U.S. Cl.
CPC ........... *H03M 1/742* (2013.01); *H03M 1/665* (2013.01)

(58) Field of Classification Search
CPC ..... H03M 1/742; H03M 1/665; H03M 1/0631
See application file for complete search history.

(56) References Cited

U.S. PATENT DOCUMENTS

| 6,801,146 | B2* | 10/2004 | Kernahan | H03L 7/0996 341/122 |
| 7,288,924 | B2* | 10/2007 | Trandafir | H02M 3/33515 323/283 |
| 7,525,823 | B2* | 4/2009 | Piper | H02M 3/33523 363/21.16 |
| 7,583,519 | B2* | 9/2009 | Piper | H02M 3/33523 363/21.16 |
| 7,714,561 | B2* | 5/2010 | Ge | H02M 3/156 363/21.18 |
| 7,843,185 | B2* | 11/2010 | Berry | H02M 1/10 323/283 |
| 8,014,879 | B2* | 9/2011 | Latham | H02M 3/157 323/283 |

(Continued)

*Primary Examiner* — Lam T Mai
(74) *Attorney, Agent, or Firm* — John R. Pessetto; Frank D. Cimino

(57) ABSTRACT

An inductive current digital-to-analog converter (DAC) includes: a power supply input adapted to be coupled to a power supply; a load terminal adapted to be coupled to a load; an inductor between the power supply input and the load terminal; and inductor current control circuitry. The inductor current control circuitry has: a sense signal input configured to receive a sense signal representative of the inductor current; a control code input configured to receive a control code; a set of switches having respective control terminals; and a set of control circuit outputs coupled to the respective control terminals of the set of switches. The inductor current control circuitry is configured to adjust control signals provided to the set of control circuit outputs based on the sense signal and the control code.

16 Claims, 14 Drawing Sheets

(56) References Cited

U.S. PATENT DOCUMENTS

| | | | | |
|---|---|---|---|---|
| 8,310,389 B1* | 11/2012 | Chui | ............... | H02M 3/157 |
| | | | | 323/283 |
| 8,487,600 B2* | 7/2013 | Prodic | ............... | H02M 3/157 |
| | | | | 323/283 |
| 8,896,279 B2* | 11/2014 | Wu | ............... | H02M 3/1588 |
| | | | | 323/272 |
| 8,908,394 B2* | 12/2014 | DeHaven | ......... | H02M 3/33515 |
| | | | | 363/21.04 |
| 11,063,516 B1* | 7/2021 | Kim | ............... | H02M 1/0006 |
| 2006/0158359 A1* | 7/2006 | Magrath | ............... | H03M 7/302 |
| | | | | 341/143 |
| 2009/0121908 A1* | 5/2009 | Regier | ............... | G01R 31/3163 |
| | | | | 341/142 |
| 2010/0201407 A1* | 8/2010 | Falter | ............... | H03K 17/0822 |
| | | | | 327/110 |
| 2013/0113642 A1* | 5/2013 | McCune, Jr. | ............ | H03F 3/16 |
| | | | | 330/251 |
| 2013/0183917 A1* | 7/2013 | Asuri | ............... | H04B 1/0483 |
| | | | | 455/127.5 |
| 2015/0015229 A1* | 1/2015 | Teh | ............... | H02M 3/157 |
| | | | | 323/284 |
| 2022/0182041 A1* | 6/2022 | Tesu | ............... | H02P 27/08 |
| 2022/0360169 A1* | 11/2022 | Pahkala | ............... | H02M 3/156 |

\* cited by examiner

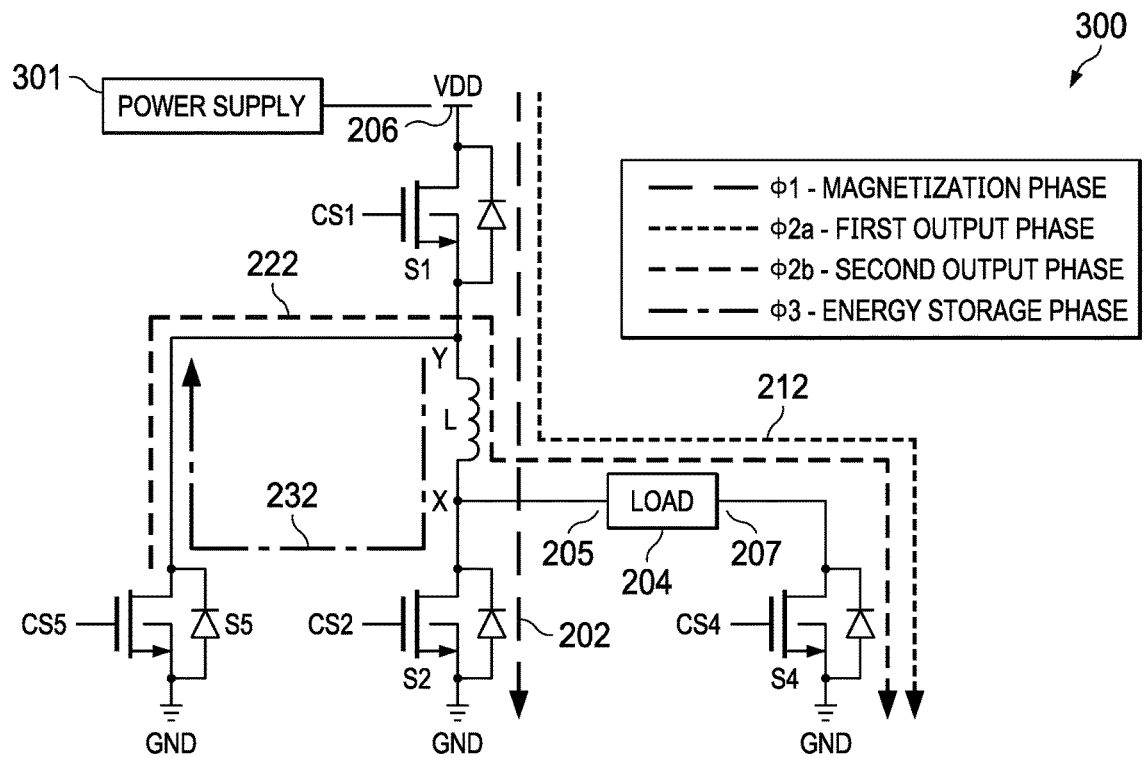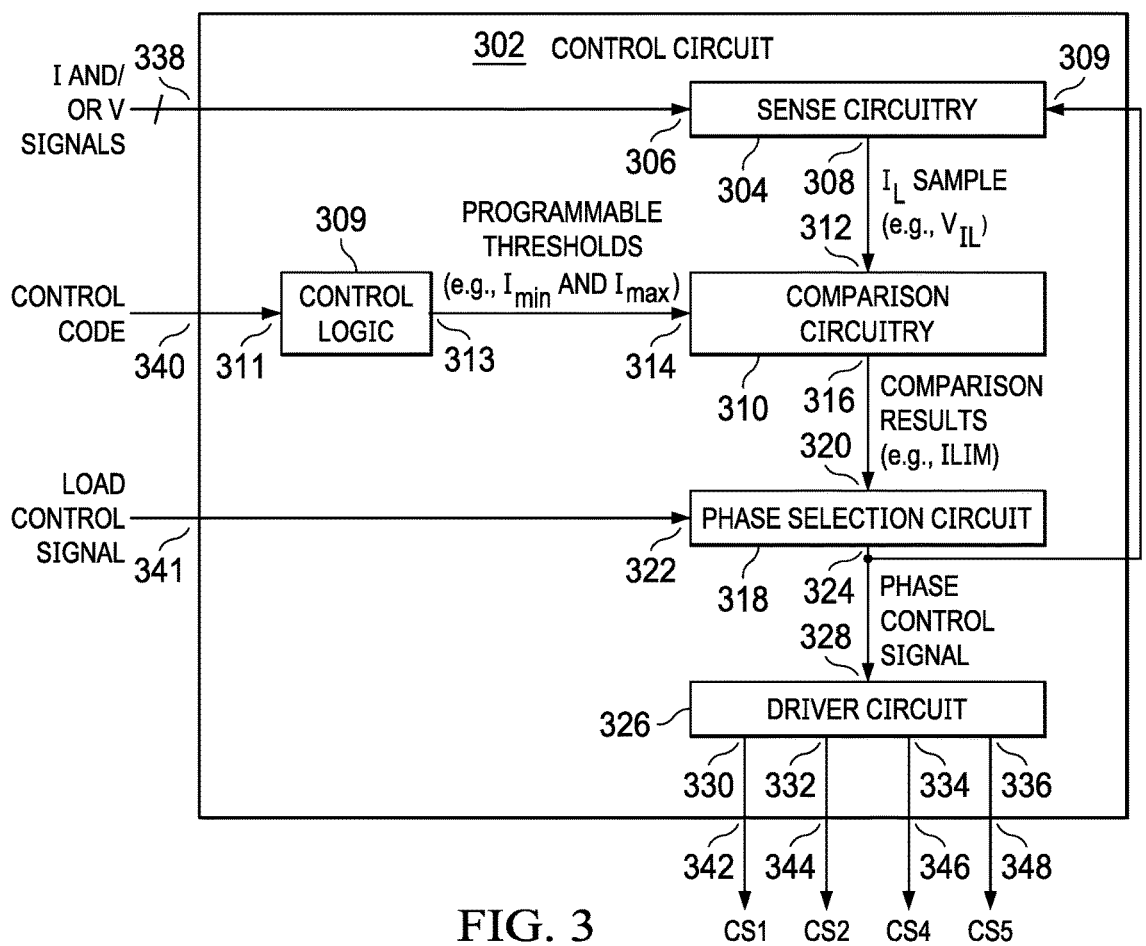
FIG. 3

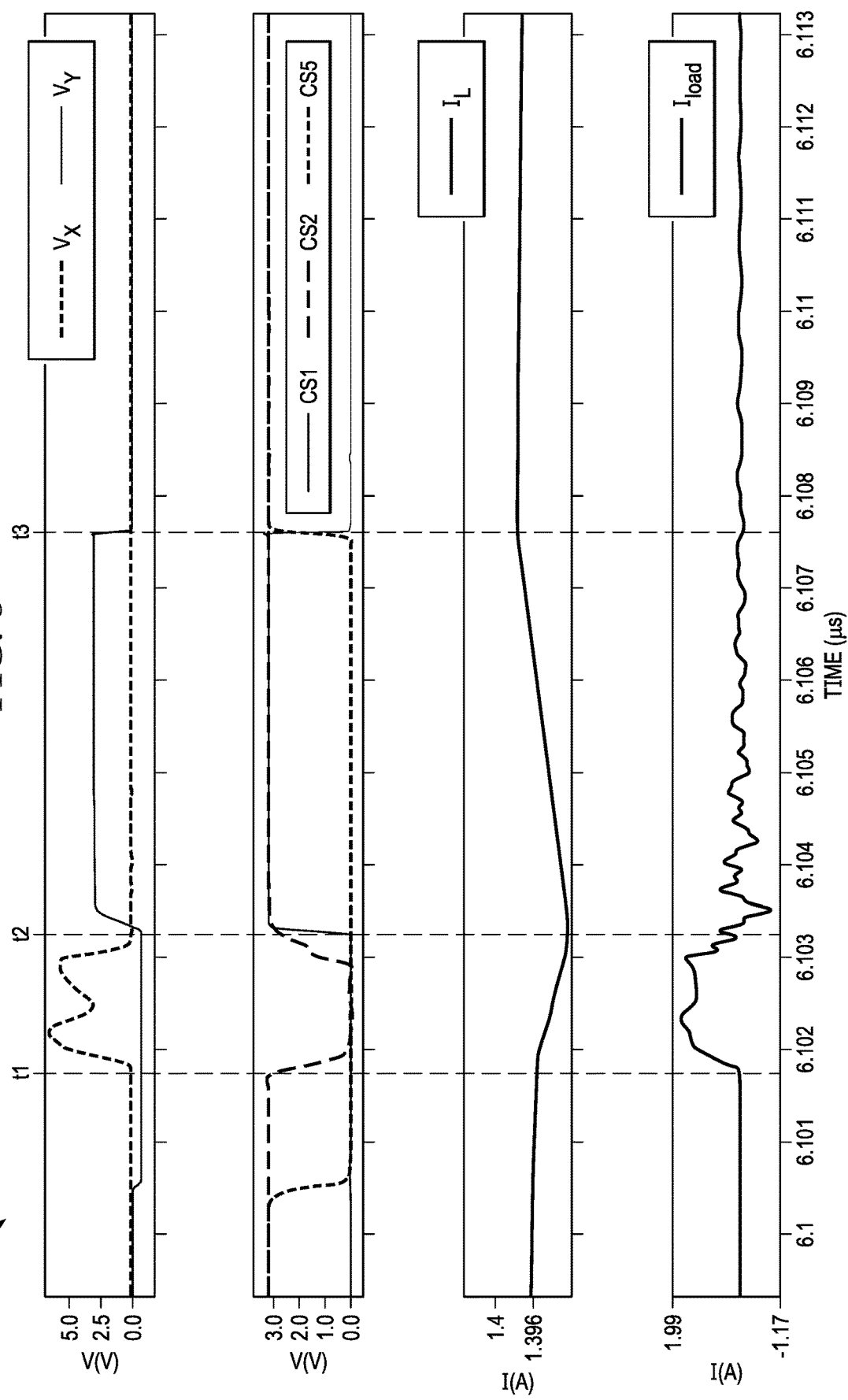

INDUCTIVE CURRENT DIGITAL-TO-ANALOG CONVERTER (DAC) AND RELATED CONTROL OPTIONS

CROSS-REFERENCE TO RELATED APPLICATION

This application claims priority to U.S. Provisional Application No. 63/191,382, filed May 21, 2021, which is hereby incorporated by reference.

BACKGROUND

Many electronic systems include a battery and a load coupled to the battery via power management circuitry. Digital-to-analog converters (DACs) that output an adjustable amount of current based on a control signal and a supply voltage (referred to as a "current DAC") may be included in such power management circuitry. However, conventional current DACs with high output current have low efficiency, which reduces battery life.

FIG. 1A is a diagram of a system 100 with a current DAC 102 in accordance with a conventional approach. In FIG. 1A, the current DAC 102 includes a current mirror 108 coupled to a current source 104 powered by a voltage supply 106. The current mirror 108 includes various transistors and capacitors (e.g., C1 and C2) in the arrangement shown, where C1 and C2 limit the headroom of the current DAC 102. The current DAC 102 also includes N current branches b0-bM, each having a respective switch (Sb0-SbM). When an enable switch (S_en) is closed, the current DAC 102 is able to output a current to an output current (Iout) terminal 110. Iout at the but terminal 110 is adjustable and is based on an N-bit control code (i.e., the N-bit control code is used to generate control signals for Sb0-SbM). The system 100 includes a load 112 (illustrated as a single light-emitting-diode, LED, or as an array of LEDs) coupled between the Iout terminal 110 and an emitter power supply (VDD_Emitter) terminal 114. Another capacitor ($C_{par}$) in FIG. 1A represents parasitic capacitance of the current DAC 102 and is between the Iout terminal 110 and ground.

FIG. 1B is a diagram of another system 120 with a current DAC 122 in accordance with a conventional approach. In FIG. 1B, the current DAC 122 includes an amplifier circuit 128 coupled to a current source 124 powered by a voltage supply 126. The amplifier circuit 128 includes an operational amplifier 129, various transistors, and a capacitor (C3) in the arrangement shown. The current DAC 122 also includes N current branches b0-bM, each having a respective switch (Sb0-SbM). When an enable switch (S_en) is closed, the current DAC 122 is able to output a current to an Iout terminal 130. Iout at the Iout terminal 130 is adjustable and is based on an N-bit control code (i.e., the N-bit control code is used to generate control signals for Sb0-SbM). The system 120 includes a load 132 coupled between the Iout terminal 130 and a VDD_Emitter terminal 134. $C_{par}$ in FIG. 1B represents parasitic capacitance of the current DAC 122 and is between the Iout terminal 110 and ground. Relative to the current DAC 102 of FIG. 1A, the current DAC 122 of FIG. 1B has improved headroom but is slower.

Regardless of the implementation, a current DAC needs good headroom to maintain accuracy, which affects efficiency. Other current DAC challenges include: load voltage drop variation across process and temperature; high-power dissipation heats up components and limits the output current capability; a speed versus accuracy tradeoff; and on-chip self-heating introduces inaccuracy to nearby circuits. As an example, an integrated ambient temperature sensor may read too high due to power dissipation of a nearby current DAC.

SUMMARY

In one example embodiment, an inductive current digital-to-analog converter (DAC) includes: a power supply input adapted to be coupled to a power supply; a load terminal adapted to be coupled to a load; an inductor between the power supply input and the load terminal; and inductor current control circuitry. The inductor current control circuitry has: a sense signal input configured to receive a sense signal representative of the inductor current; a control code input configured to receive a control code; a set of switches having respective control terminals; and a set of control circuit outputs coupled to the respective control terminals of the set of switches. The inductor current control circuitry is configured to adjust control signals provided to the set of control circuit outputs based on the sense signal and the control code.

In another example embodiment, an inductive current DAC circuit comprises: a power supply input adapted to be coupled to a power supply; a first load terminal adapted to be coupled to a first side of a load; a second load terminal adapted to be coupled to a second side of the load; a first inductor terminal coupled to the power supply input, the first inductor terminal adapted to be coupled to a first side of an inductor; and a second inductor terminal adapted to be coupled to a second side of the inductor. The inductive current DAC circuit also comprises: a first field-effect transistor (FET) having a first current terminal, a second current terminal and a first control terminal, the first current terminal of the first FET coupled to the power supply input, and the second current terminal of the first FET coupled to the first inductor terminal; a second FET having a first current terminal, a second current terminal and a second control terminal, the first current terminal of the second FET coupled to the second inductor terminal, and the second current terminal of the second FET coupled to ground; a third FET having a first current terminal, a second current terminal and a third control terminal, the first current terminal of the third FET coupled to the second load terminal, and the second current terminal of the third FET coupled to ground; and a fourth FET having a first current terminal, a second current terminal and a fourth control terminal, the first current terminal of the fourth FET coupled to the first inductor terminal, and the second current terminal of the fourth FET coupled to ground. The inductive current DAC also comprises a control circuit coupled to the first control terminal, the second control terminal, the third control terminal and the fourth control terminal, wherein the control circuit is configured to provide selectively provide control signals to the first control terminal, the second control terminal, the third control terminal, and the fourth control terminal to support different phases of the inductive current DAC.

BRIEF DESCRIPTION OF THE DRAWINGS

FIG. 3 is a schematic diagram of a system having an inductive current DAC in accordance with an example embodiment.

FIGS. 5-8 are graphs showing various signals of an inductive current DAC as a function of time in accordance with different example embodiments.

The same reference numbers (or other reference designators) are used in the drawings to designate the same or similar (structurally and/or functionally) features.

DETAILED DESCRIPTION

Figure 1A:
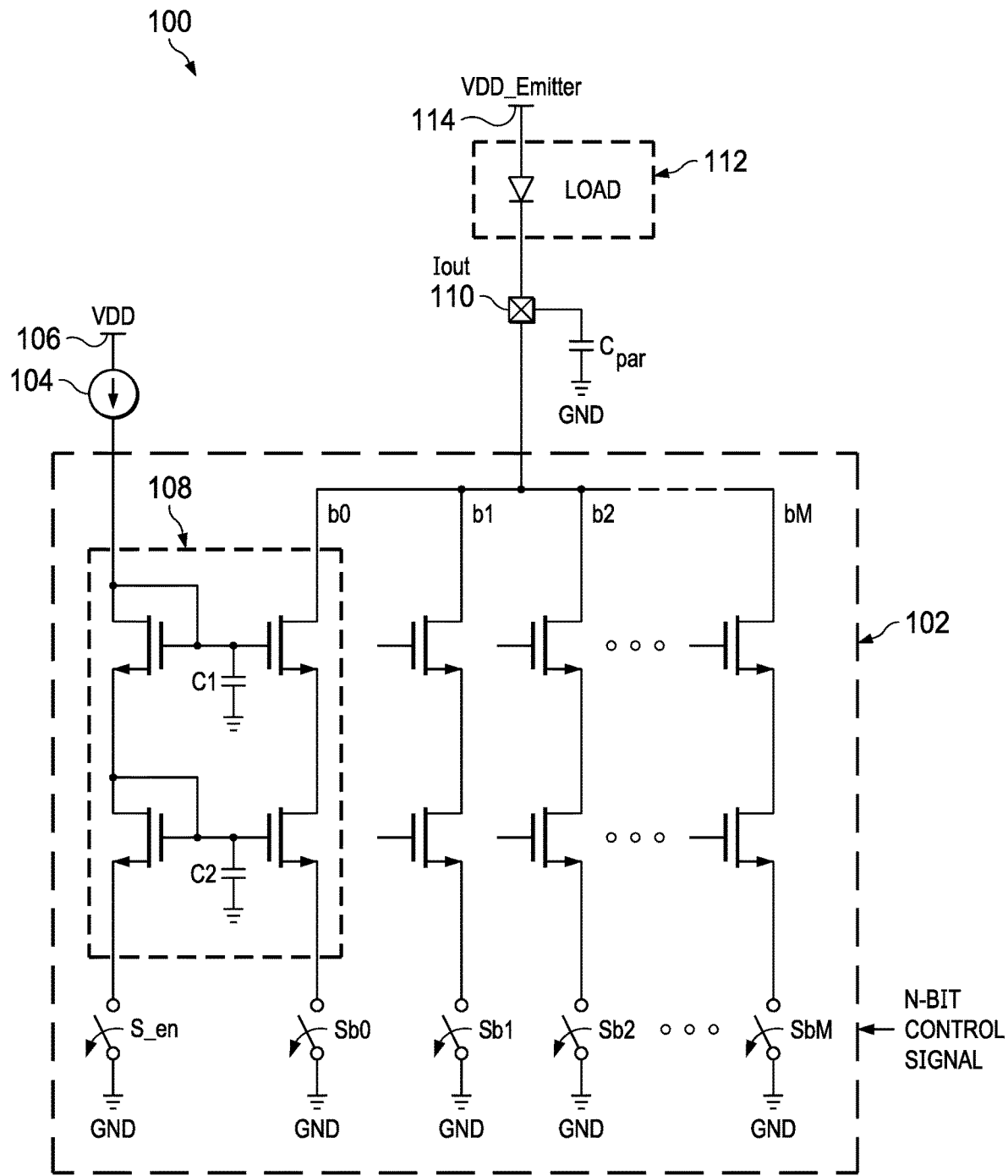
FIG. 1A is a circuit diagram of a system with a current digital-to-analog converter (DAC) in accordance with a conventional approach.
Figure 1B:
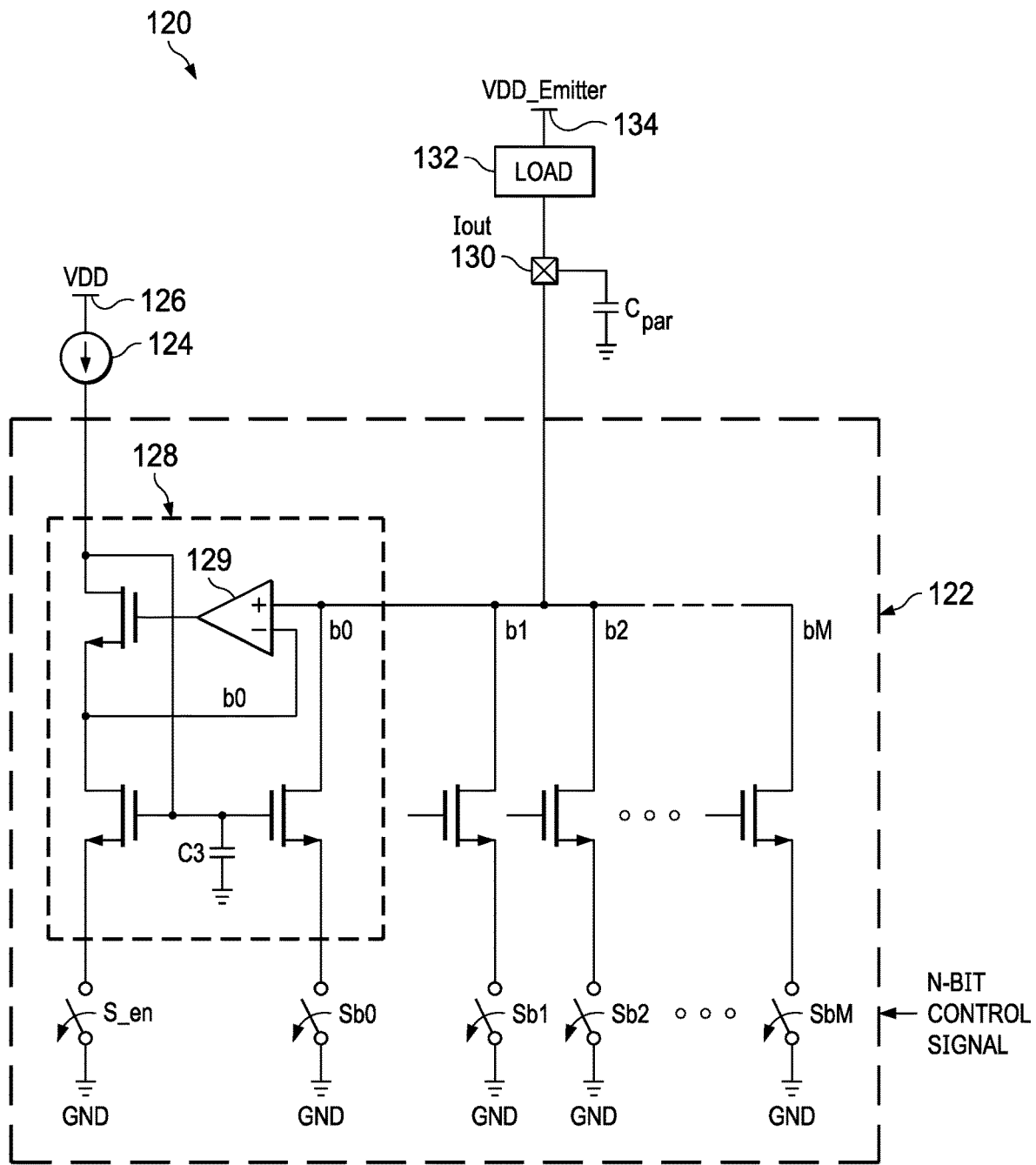
FIG. 1B is a circuit diagram of a system with another current DAC in accordance with a conventional approach.

Some example embodiments include a current digital-to-analog converter (DAC) with: an inductor; inductor current ($I_L$) control circuitry; inputs for a power supply and a control code; and an output. The topology of these current DACs is referred to herein as an "inductive current DAC". The output of the inductive current DAC is adapted to be coupled to a load. The load may vary for different systems. One example system is an optical communication system, transceiver, or transmitter having a light-emitting diode (LED) as the load, an inductive current DAC, and a host controller. In an optical communication system, the host controller may provide a load control signal and a control code to the inductive current DAC. The load control signal controls when the LED is turned on or off. The control code controls an average current through the LED when turned on.

Another example system is a proximity sensor or related product (e.g., a charging case, a security system, or industrial machine) having an LED or laser (e.g., a laser diode or vertical-cavity surface-emitting laser (VCSEL)) as the load, an inductive current DAC, a host controller, and a photoreceptor. In a proximity sensor, the host controller may provide a load control signal and a control code to the inductive current DAC. The load control signal controls when the LED or laser is turned on or off (e.g., to detect presence or proximity of an object based on reflection of or blocking of light emitted from the LED or laser). The load control signal may be based on a schedule or trigger. The control code controls an average current through the LED or laser when turned on. After the LED or laser emits lights, the photoreceptor detects related light, a reflection, or an absence of light. The output of the photoreceptor is used by response circuitry to control system operations (e.g., turn another system circuit on/off, initiate an alert, or other operation).

Another example system is a range sensor or related product (e.g., a smartphone or other mobile device) having a laser as the load, an inductive current DAC, a host controller, and a photoreceptor. In a range sensor, the host controller may provide a load control signal and a control code to the inductive current DAC. The load control signal controls when the laser is turned on or off. The load control signal may be based on a schedule or trigger. The control code controls an average current through the laser when turned on. After the laser emits lights, the photoreceptor detects reflections. The output of the photoreceptor and time-of-flight (ToF) information may be used to determine the range and/or the shape of one or more ambient objects.

Responsive to the $I_L$ control circuitry, an inductive current DAC may operate in different phases. To support the different phases, an inductive current DAC includes various switches and a control circuit for the switches. These switches and the control circuit are components of the $I_L$ control circuitry. The available phases may vary for different inductive current DAC topologies, and the selection of phases over time may vary for different loads or use scenarios.

Figure 2A:
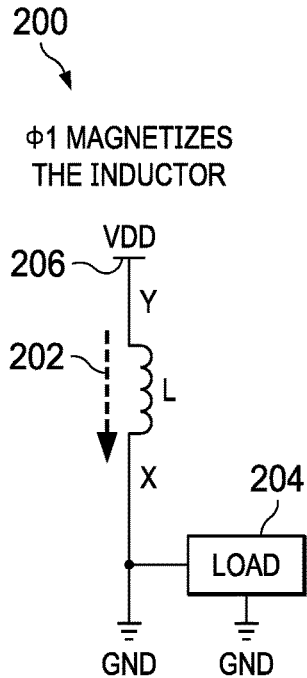
FIGS. 2A-2E are circuit diagrams showing phases of an inductive current DAC in accordance with example embodiments.

The systems illustrated in FIGS. 3, 4 and 9A-9G (collectively, FIGS. 9A-9G are referred to as FIG. 9) are example implementations of inductive current DACs of some example embodiments. FIGS. 2A-2E are diagrams showing phases (sometimes referred to herein as "modes of operation") 200, 210, 220, 230, and 240 of an inductive current DAC (such as those shown in FIGS. 3, 4 and 9) in accordance with example embodiments. FIG. 2A shows a magnetization phase 200 (labeled "φ1"). In the magnetization phase 200, an inductor L having a Y side/terminal (sometimes referred to as the first side of inductor L herein) coupled to a power supply (VDD) input 206 and an X side/terminal (sometimes referred to as the second side of inductor L herein) coupled to ground, thereby connecting both sides of a load 204 to a common potential (e.g., ground). Alternatively, the load 204 may be uncoupled from the X side of inductor L or from ground during the magnetization phase 200. In the magnetization phase 200, a magnetization phase current 202 (e.g., the current through inductor L to the common potential) increases.

Figure 2B:
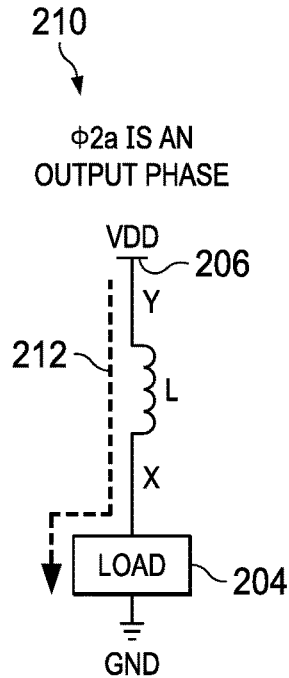

FIG. 2B shows a first output phase 210 (labeled "φ2a"). For the first output phase 210, inductor L and the load 204 are coupled in series between the power supply input 206 and ground. During the first output phase 210, a first output phase current 212 flows from power supply 206, through inductor L, to the load 204. If the voltage across the load 204 is greater than the magnitude of the power supply input 206 (e.g., VDD), $I_L$ (e.g., the current through inductor L) decreases during the first output phase 210 (e.g., the first output phase 210 has a boost function—such as realized in a boost converter). If the voltage across the load 204 is less than the magnitude of the power supply input 206 (e.g., VDD), $I_L$ increases during the first output phase 210 (e.g., the first output phase 210 has a buck function—such as realized with a buck converter).

Figure 2C:
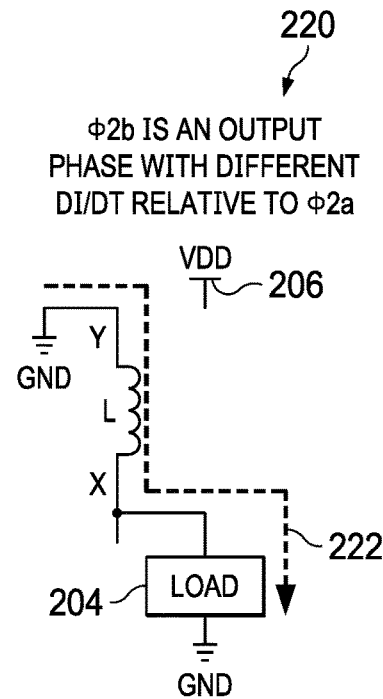

FIG. 2C shows a second output phase 220 (labeled "φ2b"). For the second output phase 220, terminal Y of inductor L is connected to ground thereby causing inductor L and the load 204 to be coupled in series between ground. In the second output phase 220, a second output phase current 222 flows through inductor L to the load 204 and $I_L$ decreases.

Figure 2D:
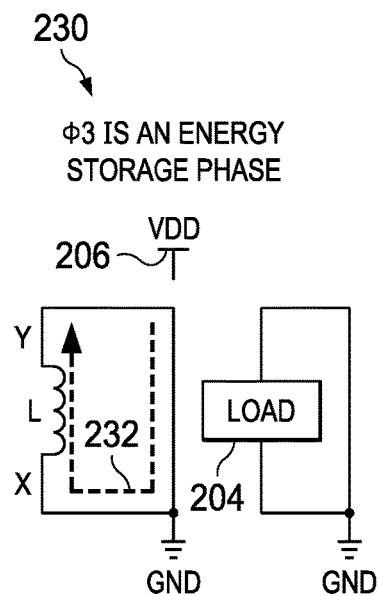

FIG. 2D shows an energy storage phase 230 (labeled "φ3"). For the energy storage phase 230, both sides of inductor L are coupled to ground and the power supply input 206 is uncoupled from the Y side of inductor L. Also, both sides of the load 204 are coupled to ground. As another option, one side or both sides of inductor L may be uncoupled from the circuit so that energy is maintained by inductor L in the energy storage phase 230. As another option, one side or both sides of the load 204 may be uncoupled from the circuit so that energy is maintained by inductor L in the energy storage phase 230. During the energy storage phase 230, an energy storage phase current 232 is retained (subject to some power dissipation over time).

Figure 2E:
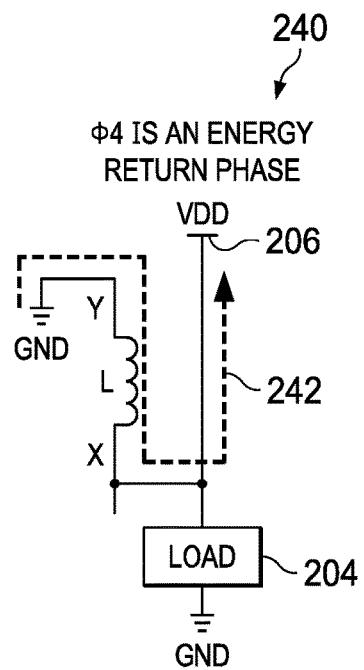

FIG. 2E shows an energy return phase 240 (labeled "φ4"). For the energy return phase 240, the Y side of inductor L is coupled to ground, and the X side of inductor L is coupled to the power supply input 206 and a first side of the load 204. The second side of the load 204 is coupled to ground. In the energy return phase 240, an energy return phase current 242 (stored in inductor L) is returned to the power supply input 206 subject to some losses (e.g., switching and conduction losses).

The phase labels φ1, φ2a, φ2b, φ3 and φ4 are not intended to suggest that the phases or modes of operation of an inductive current DAC have to be performed in a particular order. Over time, the various phases are performed as appropriate for a particular inductive current DAC topology, a particular load, and/or particular load activities. In some scenarios, the magnetization phase 200 and either of the first and second output phases 210 and 220 may be used in an alternating pattern to provide an average current level when the load 204 is active. If the activity level of the load 204 is discontinuous, the energy storage phase 230 or the energy return phase 240 may be used as appropriate (e.g., depending on which option is more efficient for a given activity level of the load 204).

In some example embodiments, an inductive current DAC may alternate between the φ2a and φ2b modes of operation to provide an average target current to the load 204 over time. This example operation may be utilized, for example, when the voltage across the load 204 is lower than the magnitude of the power supply input 206 (i.e., a buck scenario). If the voltage across the load 204 is higher than the magnitude of the power supply input 206 (i.e., a boost scenario), an inductive current DAC may alternate between the φ1 and φ2a modes of operation, or between the φ1 and φ2b modes of operation. If available, alternating between the φ1 and φ2a modes of operation is preferred over alternating between the φ1 and φ2b modes of operation because there would be less toggling (e.g., switch S1 does not toggle) with the first option. When operating in a boost mode, the output current to the load 204 is discontinuous. However, the switching frequency can be high. For example, if the load 204 is an LED, a discontinuous or pulsed output current does not affect the user experience because the switching frequency may be much higher than the human eye can detect.

FIG. 3 is a diagram of a system 300 having an inductive current DAC in accordance with an example embodiment. In the system 300, the inductive current DAC includes all of the components shown except the load 204 and/or power supply 301. In some example embodiments, the inductive current DAC components in FIG. 3 are part of an integrated circuit (IC). As another option, inductor L may be a discrete component coupled to an IC that includes the other inductive current DAC components as well as IC terminals adapted to be coupled to inductor L, the load 204, a power supply, ground, and/or a host controller configured to provide a control code.

In the example of FIG. 3, the inductive current DAC includes the power supply input 206, inductor L, various switches (S1, S2, S4, S5), and a control circuit 302 for the switches. Each diode in FIG. 3 is a body diode of a respective switch. Together, switches S1, S2, S4, and S5 and the control circuit 302 operate as $I_L$ control circuitry. As shown, switch S1 (e.g., an n-channel metal-oxide-silicon transistor, nMOS device, or any other equivalent device) is between the power supply input 206 and the Y side of inductor L. Switch S2 (e.g., an nMOS device or any other equivalent device) is between the X side of inductor L and ground. Switch S4 (e.g., an nMOS device or any other equivalent device) is between a second side of the load 204 (i.e., a second load terminal 207) and ground. The first side of the load 204 (e.g., a first load terminal 205) is coupled to the X side of inductor L. In an alternative embodiment, a switch, S3 (e.g., an nMOS device or any other equivalent device) (not shown), is connected having one current terminal (e.g., a drain) connected to a power supply (e.g., VDD) terminal (such as terminal 206), a second current terminal (e.g., a source) connected to the second load terminal 207 and a control terminal (e.g., a gate) connected to control circuit 302 (to receive, for example, control signal CS3). Switch S5 (e.g., an nMOS device or any other equivalent device) is between the Y side of inductor L and ground. By controlling the on/off states of switches S1, S2, S4, and S5, the control circuit 302 selectively supports the magnetization phase 200, the first output phase 210, the second output phase 220, the energy storage phase 230 and/or the energy return phase 240 (e.g., with the addition of an additional switch or other equivalent device) described in FIGS. 2A-2E.

In the example of FIG. 3, the control circuit 302 includes first control circuit inputs 338, a second control circuit input 340, a third control circuit input 341, and control circuit outputs 342, 344, 346, and 348. Control circuit 302 may be implemented using a processor, microcomputer, digital circuitry, analog circuity, a state machine, an application specific integrated circuit (ASIC), a field-programmable gate array (FPGA), memory, software and/or any combination thereof. The first control circuit inputs 338 are configured to receive sense signals (e.g., current sense signals and/or voltage sense signals) indicating the current through inductor L. In some example embodiments, the first control circuit inputs 338 may be coupled to the different terminals (e.g., the Y side of inductor L, the X side of inductor L, and/or different current terminals of the switches S1, S2, S4, and S5) of the inductive current DAC of FIG. 3. Depending on the inductive current DAC phase or mode of operation, the voltage at one or more of these terminals indicates $I_L$. As an alternative option, it is possible to directly sense $I_L$. The second control circuit input 340 is configured to receive a control code (e.g., from the host controller of a system that includes the inductive current DAC of FIG. 3) indicating a target current level for the load 204. The third control circuit input 341 is configured to receive a load control signal (e.g., from the host controller of a system that includes the inductive current DAC of FIG. 3). The control circuit output 342 is configured to provide a control signal (CS1) for switch S1. The control circuit output 344 is configured to provide a control signal (CS2) for switch S2. The control circuit output 346 is configured to provide a control signal (CS4) for switch S4. The control circuit output 348 is configured to provide a control signal (CS5) for switch S5.

For the magnetization phase (φ1) mode of operation (related to the magnetization phase current 202), the control circuit 302 is configured to assert (e.g., a logic high or a logic "1" where switches S1 and S2 are implemented using nMOS devices) CS1 and CS2 to turn on (e.g., to cause to be conducting) switches S1 and S2, while CS4 and CS5 are de-asserted (e.g., a logic low or a logic "0" where S4 and S5 are implemented using nMOS devices) to turn off (e.g., to cause to be non-conducting) switches S4 and S5. If the load 204 is an LED, a laser diode, or other load that needs a threshold voltage to conduct current, CS4 can be asserted (e.g., turned on/cause to conduct) for the φ1 mode of operation. As another option, one or both sides of the load 204 may be uncoupled from the rest of the circuit during the φ1 mode of operation. For the first output phase (φ2a) mode of operation (related to the first output phase current 212), the control circuit 302 is configured to assert CS1 and CS4 to turn on switches S1 and S4, while CS2 and CS5 are de-asserted to turn off switches S2 and S5. For the second output phase (φ2b) mode of operation (related to the second output phase current 222), the control circuit 302 is configured to assert CS4 and CS5 to turn on switches S4 and S5, while CS1 and CS2 are de-asserted to turn off switches S1 and S2. For the energy storage phase (φ3) mode of operation (related to the energy storage phase current 232), the control circuit 302 is configured to assert CS2 and CS5 to turn on switches S2 and S5, while CS1 and CS4 are de-asserted to turn off switches S1 and S4. In an alternative example, the energy storage phase (φ4) mode of operation may be implemented, with additional devices for example, by connecting terminal X to terminal Y but without connecting either terminal to ground.

In some example embodiments, the control circuit 302 includes sense circuitry 304 having sense circuitry inputs 306 and a sense circuitry output 308. In some example embodiments, the sense circuitry 306 includes a multiplexer or other signal forwarding logic controlled by a phase control signal (indicating the phase or mode of operation in use). The sense circuitry inputs 306 (which may, for example, receive a sampled or sensed value of the inductor current and/or related voltage values) are coupled to the first control circuit inputs 338. In one example embodiment, the voltage at the X side of inductor L and the voltage at the Y side of the inductor L are received by the sense circuitry inputs 306. Depending on the phase or mode of operation, the voltage at the X side of inductor L or the voltage at the Y side of inductor L is proportional to $I_L$. the sense circuitry 304 is configured to provide a sample or sensed value of $I_L$ (e.g., $V_{IL}$, where $V_{IL}$ is a voltage that represents $I_L$ or is proportional to $I_L$ for a given phase or mode of operation of the inductive current DAC) to the sense circuitry output 308. In the example of FIG. 3, the $I_L$ sample is provided by the sense circuitry 304 to comparison circuitry 310. In one example, the comparison circuitry 310 includes a first comparator and a second comparator. The first comparator is configured to compare the $I_L$ sample to a minimum current threshold ($I_{min}$ or a related voltage value). The second comparator is configured to compare the $I_L$ sample to a maximum current threshold ($I_{max}$ or a related voltage value). In the example of FIG. 3, the comparison circuitry 310 includes a first comparison circuitry input 312, second comparison circuitry inputs 314, and a comparison circuity output 316. The first comparison circuitry input 312 is coupled to the sense circuitry output 308 and is configured to receive the $I_L$ sample. The second comparison circuitry inputs 314 are coupled to control logic 309 and are configured to receive $I_{min}$ and $I_{max}$ or related voltage values from the control logic 309.

In some example embodiments, the control logic 309 has a control logic input 311 and control logic outputs 313. In some example embodiments, the control logic 309 includes a digital controller, logic gates, programmable reference voltage sources, and/or other components configured to generate programmable thresholds for the comparison circuitry 314 based on the control code (e.g., 0001 to 1111, indicating different target current levels). The control logic input 311 is coupled to the second control circuit input 340 and is configured to receive a control code (e.g., from a host controller of a system that includes the inductive current DAC) that indicates a target current level for the load 204. In one example, the control logic 309 generates two control signals based on the target current level indicated by the control code (e.g., the control signals defining an $I_L$ range that will be used so that an average $I_L$ can be provided as needed). A first of the two control signals is provided to a first programmable reference voltage source configured to generate a first reference voltage indicating $I_{max}$ (an upper limit for $I_L$). A second of the two control signals is provided to a second programmable reference voltage source configured to generate a second reference voltage indicating $I_{min}$ (a lower limit for $I_L$). The control logic outputs 313 are coupled to the second comparison circuitry inputs 314 (e.g., to provide the first and second reference voltages to the comparison circuitry 310. In some example embodiments, the control logic 309 may also account for a predetermined tolerance (e.g., within 5%) for the target current level when selecting $I_{min}$ and $I_{max}$.

Figure 5:
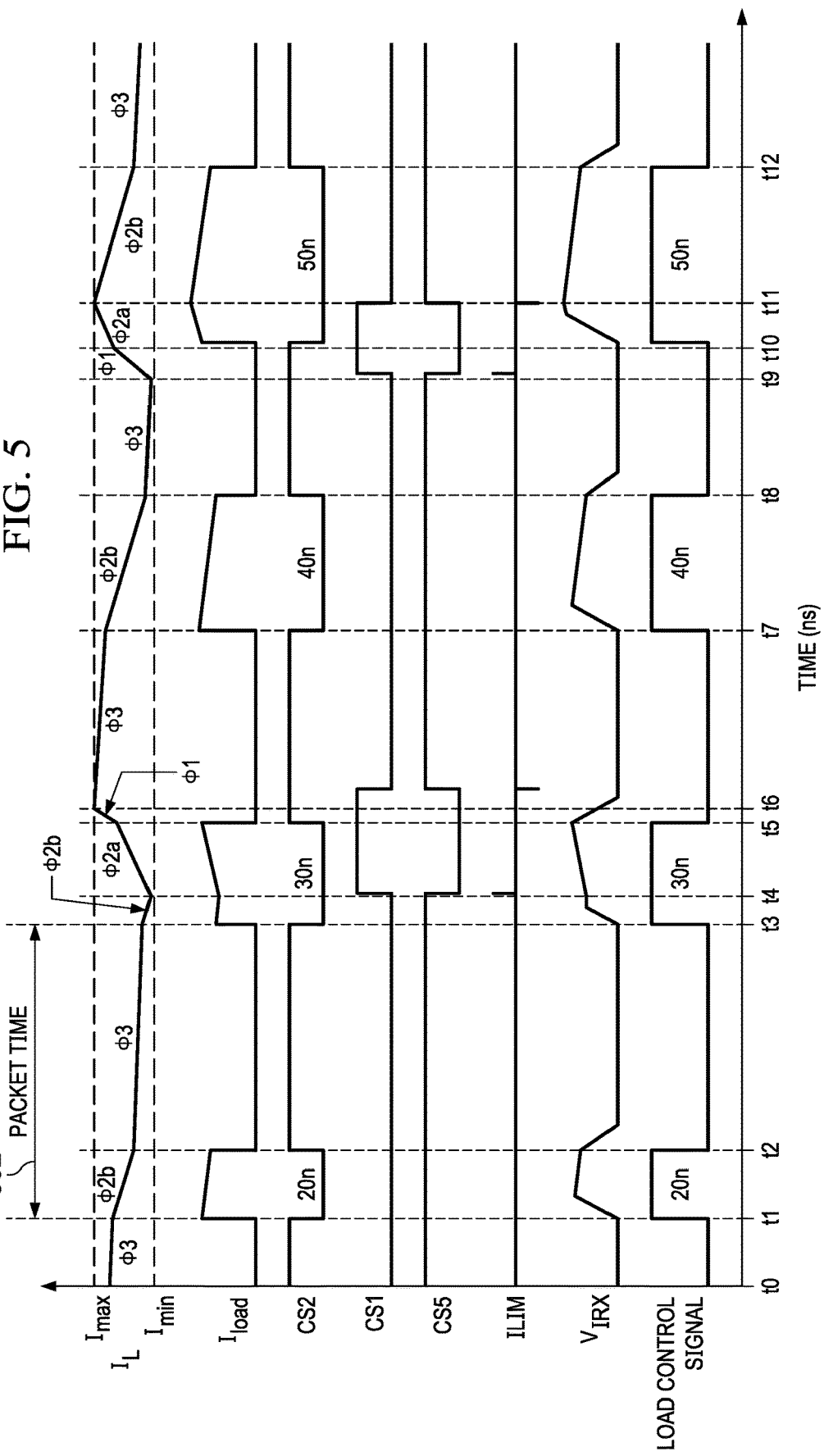

In the example of FIG. 3, the comparison circuitry 310 is configured to output comparison results (e.g., voltage and/or current values that are representative of the comparisons of the inductor current and/or inductor voltage versus minimum and/or maximum threshold values, such as $I_{min}$ and $I_{max}$) to a phase selection circuit 318. In some example embodiments, the comparison circuitry 310 includes a first comparator configured to compare a voltage representing the $I_L$ sample output from the sense circuitry 304 with a first reference voltage representing $I_{max}$. The comparison circuitry 310 may also include a second comparator configured to compare a voltage representing the $I_L$ sample output from the sense circuitry 304 with a second reference voltage representing $I_{min}$. In some example embodiments, the phase selection circuit 318 is a state machine and related circuitry. As shown, the phase selection circuit 318 includes a first phase selection circuit input 320, a second phase selection circuit input 322, and a phase selection circuit output 324. The first phase selection circuit input 320 is coupled to the comparison circuitry output 316 so as to receive the comparison value(s) output by comparison circuitry 318. The second selection circuit input 322 is configured to receive a load control signal (e.g., the load control signal in FIG. 5 or another on/off control signal). In some example embodiments, the load control signal may not be utilized. For example, in some scenarios, the inductive current DAC is configured to maintain a current at the output (e.g. driving an LED with an average current). In such scenarios, the comparison results of the comparison circuitry 310 may be used, but not load activity information. On the other hand, if the inductive current DAC of FIG. 3 is configured to drive a vertical-cavity surface-emitting laser (VCSEL) with pulses, load activity information may be used to control the flow of current (e.g., to select when to turn off switch S2).

In operation, the phase selection circuit 318 is configured to provide a phase control signal at the phase selection circuit output 324 based on current limit (ILIM) events (e.g., ILIM indicates when $I_L$ drops to $I_{min}$ or reaches $I_{max}$) received at the first phase selection circuit input 320 and possibly load activity information received at the second phase selection circuit input 322. For example, when the comparison results indicate $I_L$ drops to $I_{min}$, the phase selection circuit 318 may provide a phase control signal to initiate the φ1 mode of operation to increase $I_L$. When the comparison results indicate $I_L$ reaches $I_{max}$, the phase selection circuit 318 may provide a phase control signal to initiate the φ2a mode of operation or the φ2b mode of operation to provide current to the load 204. When the load activity information indicates that the load 204 will be inactive for less than a threshold time interval (e.g., a time interval associated with 50% energy dissipation of inductor L, or some other energy dissipation metric), the phase selection circuit 318 may provide a phase control signal to initiate the energy storage phase (φ3) mode of operation. When the load activity information indicates that the load 204 will be inactive for the threshold time interval or more (e.g., a time interval associated with 50% energy dissipation of inductor L, or some other energy dissipation metric), the phase selection circuit 318 may provide a phase control signal to temporarily disable or turn off the inductive current DAC of FIG. 3.

In the example of FIG. 3, the driver circuit 326 includes a driver circuit input 328 coupled to the phase selection circuit output 324. In some example embodiments, the driver circuit 326 includes level shift circuitry, buffer circuitry, and/or other circuitry to provide the voltage and/or the current needed for switch control signals (CS1, CS2, CS4, and CS5) based on the phase control signal. As shown, the driver circuit 326 also includes driver circuit outputs 330, 332, 334, and 336 coupled to respective control circuit outputs 342, 344, 346, and 348. Depending on the phase related to the phase control signal provided by the phase selection circuit 318 to the driver circuit input 328, the driver circuit 326 is configured to provide CS1, CS2, CS4, and CS5 to the respective control circuit outputs 342, 344, 346, and 348.

Figure 4:
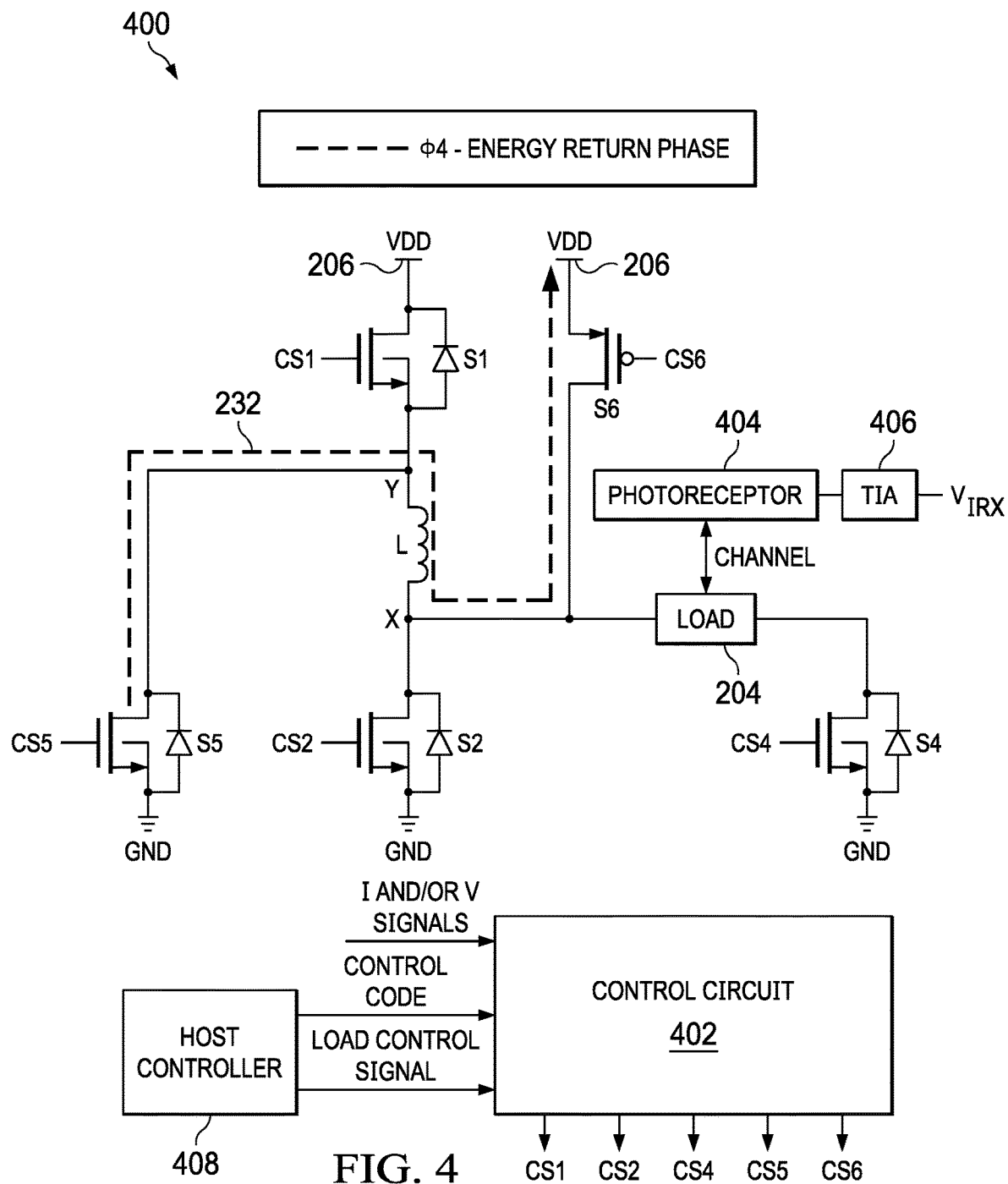
FIG. 4 is a schematic diagram of an optical communication system having an inductive current DAC in accordance with another example embodiment.

FIG. 4 is a diagram of an optical communication system 400 having an inductive current DAC in accordance with another example embodiment. In the optical system 400, the inductive current DAC includes all of the components shown except the load 204 and optical receiver components (e.g., the photoreceptor 404 and the transimpedance amplifier (TIA) 406). In some example embodiments, the load 204 is an LED (e.g., part of an optical transmitter coupled to a host controller configured to provide data, a control code, and a load control signal) controlled by the inductive current DAC. When the LED is turned on, light from the LED is conveyed via a channel (e.g., air or an optical fiber) to the photoreceptor 404. The output of the photoreceptor 404 is a current received by the TIA 406. The TIA 406 converts the current from the photoreceptor 404 to an optical receiver current signal ($V_{IRX}$), which is a voltage that indicates the optical receiver current due to the light emitted from the LED. In some example embodiments, the inductive current DAC components in FIG. 4 are part of an IC (e.g., a singulated semiconductor die). As another option, inductor L may be a discrete component coupled to an IC that includes the other inductive current DAC components as well as IC terminals adapted to be coupled to inductor L, the load 204, a power supply, ground, and a controller configured to provide a control code.

As shown, the inductive current DAC of FIG. 4 has the same topology as the inductive current DAC of FIG. 3 with the addition of a switch (S6) between the X side of inductor L and the power supply input 206. With the topology of the inductive current DAC of FIG. 4, the control circuit 402 is configured to support an energy return phase (φ4) mode of operation in addition to φ1, φ2a, φ2b, and φ3 modes of operation. For the energy return phase, the control circuit 402 is configured to assert CS5 and CS6 to turn on switches S5 and S6 (implemented, for example, using a p-channel metal-oxide-silicon field effect transistor, pMOS device, or other equivalent device) while CS1, CS2 and CS4 are de-asserted to turn off switches S1, S2 and S4. The control circuit 402 may include the same or similar components as the control circuit 302. For example, when the load activity information indicates that the load 204 will be inactive for the threshold time interval or more (e.g., a time interval associated with 50% energy dissipation of inductor L, or some other energy dissipation metric), the control circuit 402 may be configured to select the energy return phase before disabling or turning off the inductive current DAC of FIG. 4. In the implementation illustrated in FIG. 4, switch S6 is implemented using a pMOS device. In order to turn on switch S6, the CS6 signal may be a logic low or logic "0" signal.

FIGS. 5-8 include graphs 500, 600, 700 and 800 showing various signals of an inductive current DAC as a function of time (x-axis) in accordance with different example embodiments. In the graph 500 of FIG. 5, waveforms related to an optical communication system are shown, including: $I_L$, $I_{load}$, CS2, CS1, CS5, ILIM) $V_{IRX}$ (e.g., $V_{IRX}$ in FIG. 4), and a load control signal (e.g., the load control signal in FIG. 3). $I_{min}$ and $I_{max}$ thresholds are also represented in graph 500. Without limitation, graph 500 is representative of an optical communications scenario with hysteretic control using an inductive current DAC.

At time t0, $I_L$ is near $I_{max}$ and φ3 is used to maintain $I_L$. For the φ3 mode of operation, CS2 is asserted, CS1 is de-asserted, and CS5 is asserted. At time t1, the load control signal is asserted for an interval (e.g., 20 ns) as directed by a host controller for the related optical communication system (e.g., the duration of the assertion is used to indicate "1" values in a bit sequence). In response, CS2 is de-asserted to transition from the φ3 mode of operation to the φ2b mode of operation. From time t1 to time t2, the φ2b mode of operation is used to provide $I_{load}$ while the load control signal is asserted. As shown, $V_{IRX}$ roughly follows $I_{load}$ with slower rise times, slower fall times, linear magnitude scaling, and some variation in the magnitude of the $V_{IRX}$ value. At time t2, the load control signal is de-asserted for an interval as directed by a host controller for the related optical communication system (e.g., the duration of the de-assertion is used to indicate "0" values in a bit sequence). In response, CS2 is asserted to transition from the φ2b mode of operation to the φ3 mode of operation, resulting in $I_{load}$ being de-asserted. At time t3, the load control signal is asserted again for an interval (e.g., 30 ns) as directed by a host controller for the related optical communication system (e.g., the duration of the assertion is used to indicate "1" values in a bit sequence). In response, CS2 is de-asserted to transition from the φ3 mode of operation to the φ2b mode of operation. From time t3 to time t4, the φ2b mode of operation is used to provide $I_{load}$. In graph 500, the arrow 502 indicates an example time between time t1 and time t3 is greater than a packet time (e.g., a universal serial bus (USB) packet or other communication protocol packet) related to communications of an optical transmitter based on an inductive current DAC.

At time t4, $I_L$ drops to $I_{min}$ and ILIM provides a related indication. In response, CS1 is asserted and CS5 is de-asserted to transition from the φ2b mode of operation to the φ2a mode of operation. At time t5, the load control signal is de-asserted for an interval as directed by a host controller for the related optical communication system (e.g., the duration of the de-assertion is used to indicate "0" values in a bit sequence). In response, CS2 is asserted to transition from the φ2a mode of operation to the φ1 mode of operation. At time t6, $I_L$ reaches $I_{max}$. In response, ILIM provides a related indication, resulting in CS1 being de-asserted and CS5 being asserted to transition from the φ1 mode of operation to the φ3 mode of operation. At time t7, the load control signal is asserted again for an interval (e.g., 40 ns) as directed by a host controlled for an optical communication system (e.g., (e.g., the duration of the assertion is used to indicate "1" values in a bit sequence). In response, CS2 is de-asserted to transition from the φ3 mode of operation to the φ2b mode of operation. From time t7 to time t8, the φ2b mode of operation is used to provide $I_{load}$ while the load control signal is asserted. At time t8, the load control signal is de-asserted as directed by a host controlled for an optical communication system (e.g., the duration of the assertion is used to indicate "0" values in a bit sequence). In response, CS2 is asserted to transition from the φ2b mode of operation to the φ3 mode of operation, resulting in $I_{load}$ being de-asserted. At time t9, $I_L$ drops to $I_{min}$ and ILIM provides a related indication. In response, CS1 is asserted and CS5 is de-asserted to transition from the φ3 mode of operation to the φ1 mode of operation. At time 10, the load control signal is asserted again as directed by a host controlled for an optical communication system (e.g., the duration of the assertion is used to indicate "1" values in a bit sequence). In response, CS2 is de-asserted to transition from the φ1 mode of operation to the φ2a mode of operation. From time t9 to time t10, the φ2a mode of operation is used to provide $I_{load}$. At time t11, $I_L$ reaches $I_{max}$. In response, ILIM provides a related indication, resulting in CS1 being de-asserted and CS5 being asserted to transition from the φ2a mode of operation to the φ2b mode of operation. At time t12, the load control signal is de-asserted. In response, CS2 is asserted to transition from the φ2b mode of operation to the φ3 mode of operation.

Figure 6:
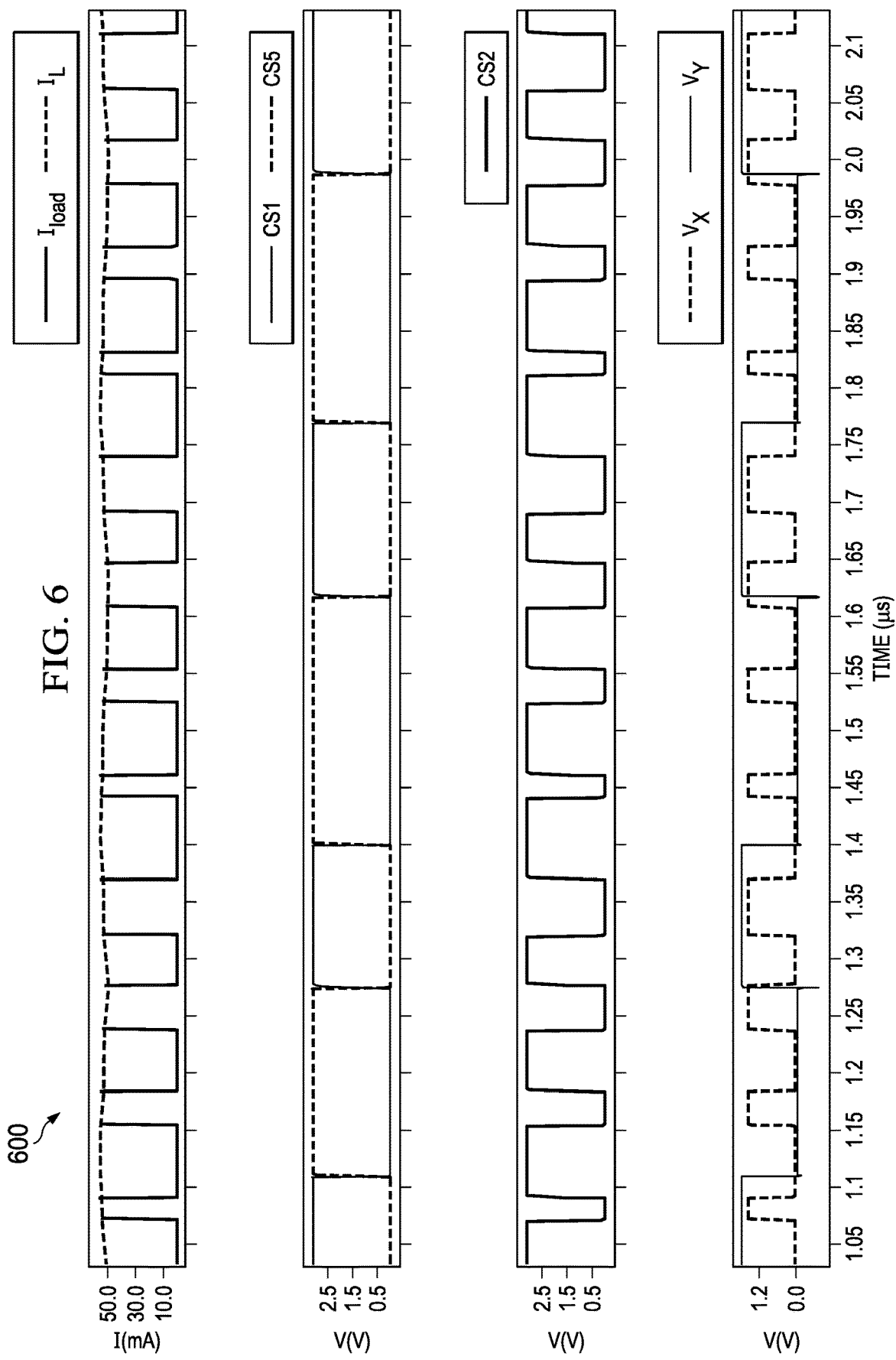

In the graph 600 of FIG. 6, waveforms are shown for $I_{load}$, $I_L$, CS1, CS5, CS2, the voltage at the X side of inductor L ($V_X$), and the voltage at the Y side of inductor L ($V_Y$). As shown in FIG. 6, the x-axis represents time (in microseconds) and the y-axis represents voltage (in Volts) or current (in milliamperes) In graph 600, CS1 and CS5 are controlled (so that the inductive current DAC alternates between the φ2a and φ2b modes of operation) to maintain $I_L$ between two values (e.g., around 50 mA in the example of FIG. 6). Also, CS2 is controlled to turn $I_{load}$ on or off (e.g., based on a load control signal), $V_Y$ follows CS1, and $V_X$ follows CS2. Without limitation, graph 600 is representative of an optical communications scenario based on an inductive current DAC providing current to an optical transmitter (an example of the load 204 in an optical communications system such as the optical communications system 400 in FIG. 4).

Figure 7:
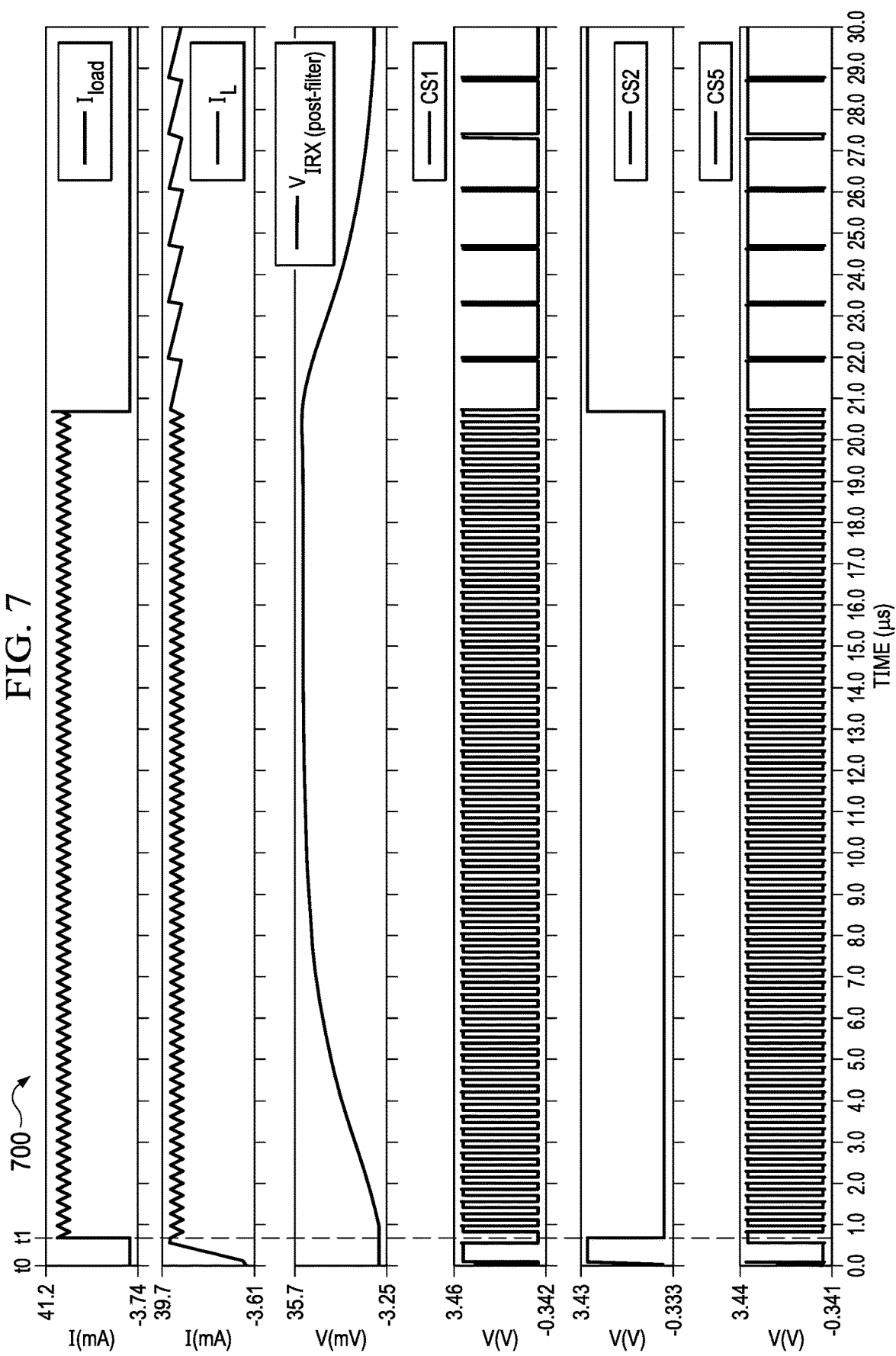

In the graph 700 of FIG. 7, waveforms are shown for $I_{load}$, $I_L$, $I_{RX}$ (post-filter), CS1, CS2, and CS5. In graph 700, the x-axis is time (in microseconds) and the y-axis is voltage (in voltage or millivolts) or current (in milliamps). $I_L$ is initially low at time t0. From time t0 to time t1, CS1, CS2, and CS5 are controlled to ramp up $I_L$ to a target level. Once $I_L$ reaches the target level at time t1, $I_{load}$ is asserted. After time t1, CS1 and CS5 are controlled (i.e., the inductive current DAC alternates between the φ2a and φ2b modes of operation) to maintain $I_L$ and $I_{load}$ at a target level. $V_{IRX}$ (post-filter) ramps up more slowly to a target level based on $I_{load}$. Without limitation, graph 700 is representative of proximity sensing via reflected light magnitude using an inductive current DAC to control the output current to a light source (see e.g., the system 950 of FIG. 9F).

In the graph 800 of FIG. 8, waveforms are shown for $V_X$, $V_Y$, CS1, CS2, CS5, $I_L$, and $I_{load}$. In graph 800, the x-axis is time (in microseconds) and the y-axis is voltage (in voltage) or current (in amps). As shown in graph 800, CS1, CS5, and CS2 are initially controlled to maintain $I_L$ at a target level using the φ3 mode of operation until time t1. For the φ3 mode of operation, CS1 is de-asserted, CS2 is asserted, and CS5 is asserted initially. As an option, CS5 may de-asserted as shown. At time t1, CS1, CS2, and CS5 are controlled (e.g., CS1 de-asserted, CS2 asserted, and CS5 de-asserted) to operate an inductive current DAC in the φ1 mode of operation with conduction through the body diode of S5. At time t2, CS1, CS2, and CS5 are controlled (e.g., CS2 de-asserted, CS1 de-asserted, and CS5 de-asserted) to operate an inductive current DAC in an output phase (e.g., φ2a or φ2b) mode of operation. At time t3, CS1, CS2, and CS5 are controlled (e.g., CS1 asserted, CS2 asserted, and CS5 de-asserted) to operate an inductive current DAC in the φ3 mode of operation ($I_L$ is maintained in φ3). Without limitation, graph 800 is representative of VCSEL ToF sensor operations using an inductive current DAC to provide current to the VCSEL (see e.g., the system 960 of FIG. 9G).

FIG. 9A-9G are diagrams showing systems 900, 910, 920, 930, 940, 950, and 960 having inductive current DACs in accordance with various alternative example embodiments. In the systems 900, 910, 920, 930, 940, each inductive current DAC includes all of FIG. 9F, the system 950 is related to a proximity sensor scenario, and additionally includes a host controller 408A (an example of the host controller 408 in FIG. 4), a photoceptor 952, and a proximity analyzer 954. The photoreceptor 952 is configured to provide a current in response to light emitted by the load 204 (e.g., based to the control code and load control signal provided by the host controller 408A). In some example embodiments, the proximity analyzer 954 (e.g., an analog circuit and/or digital circuit configured to compare the current from the photoreceptor 952 with one or more thresholds) is coupled to the photoreceptor 952 and is configured to determine a proximity value or result for the system 950 based on the comparison. The results from the proximity analyzer 954 are provided to the host controller 408A or other control circuitry of the system 950 (e.g., to trigger system operations based on proximity or lack of proximity results).

Figure 9A:
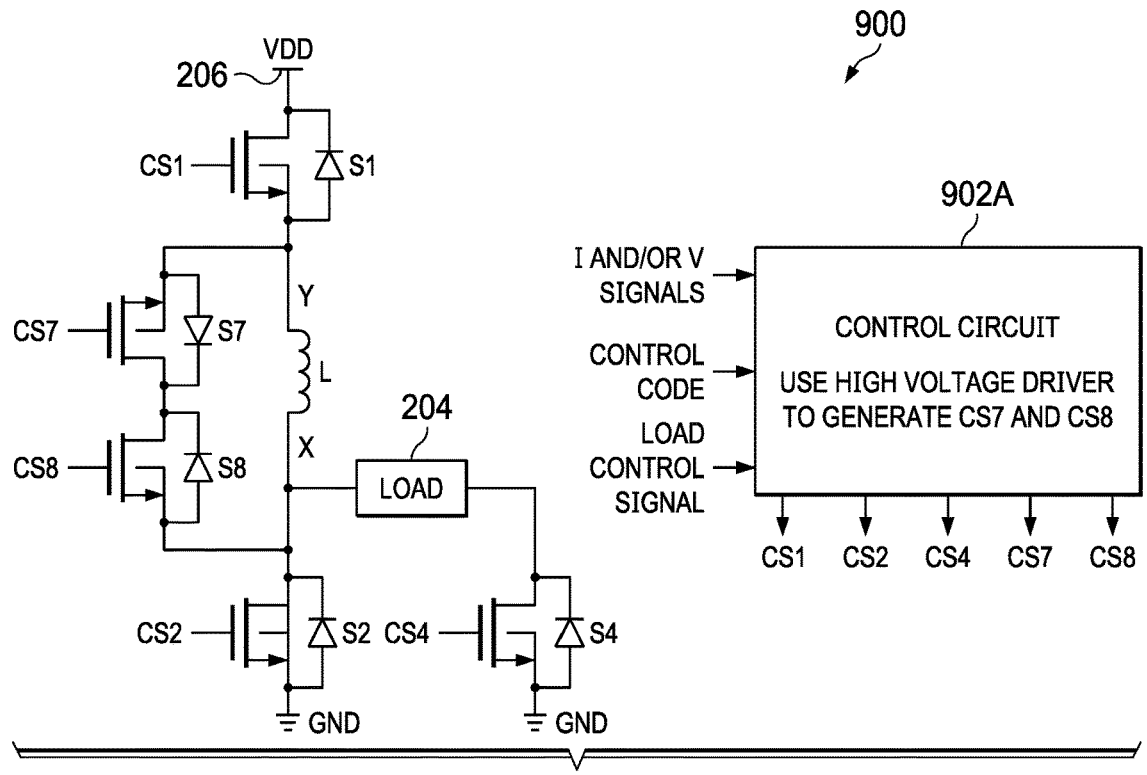
FIG. 9A-9G are schematic diagrams showing systems having inductive current DACs in accordance with various alternative example embodiments.
Figure 9B:
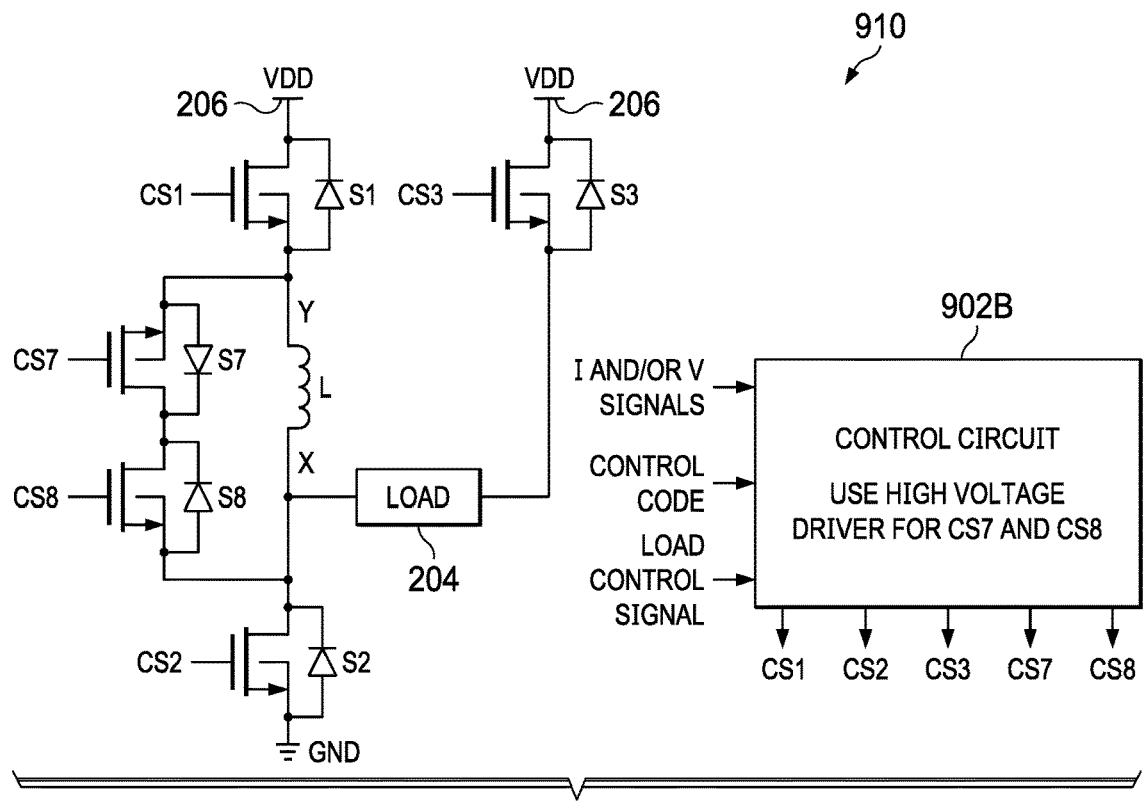
Figure 9C:
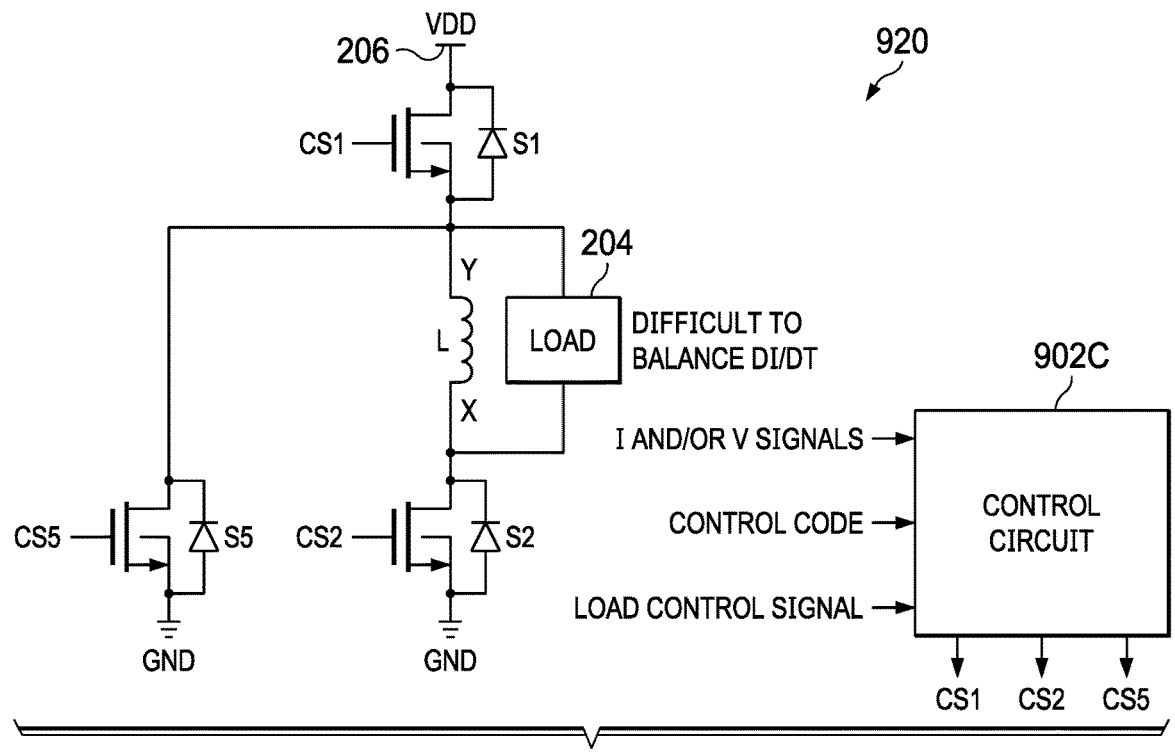
Figure 9D:
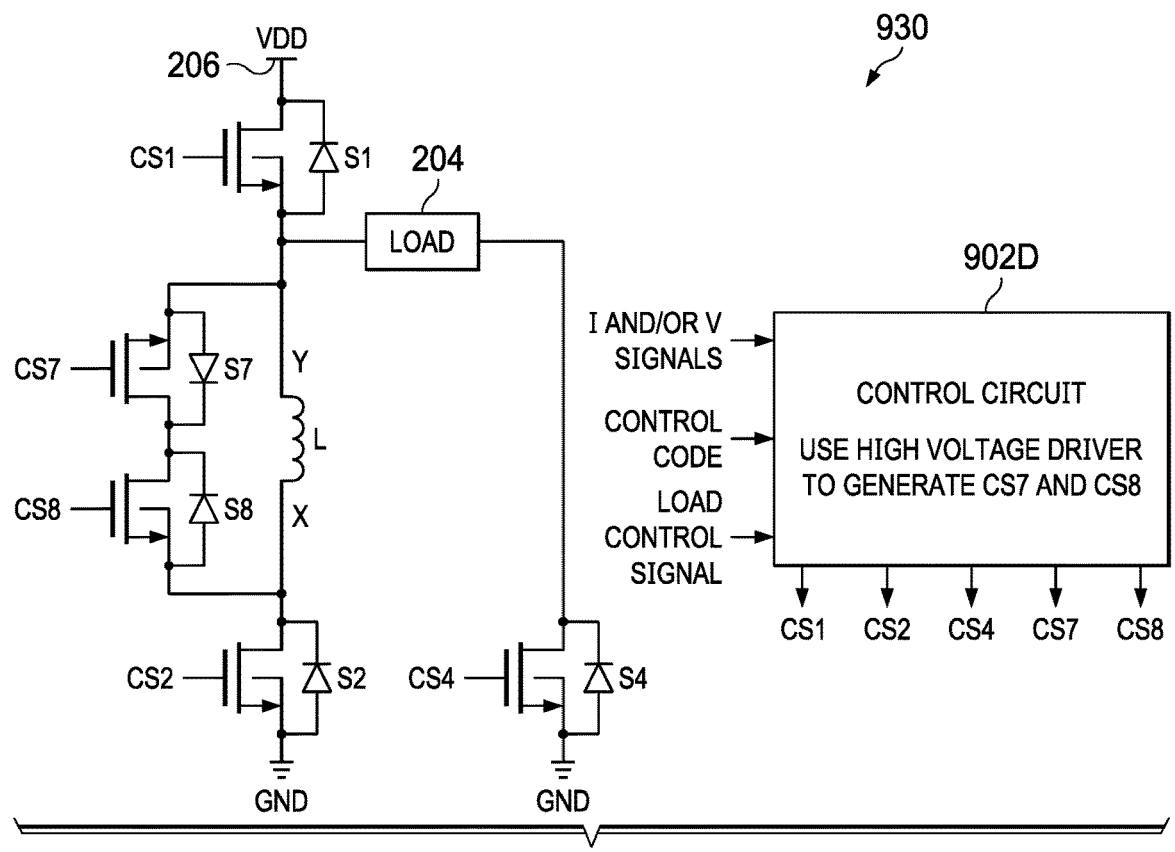
Figure 9E:
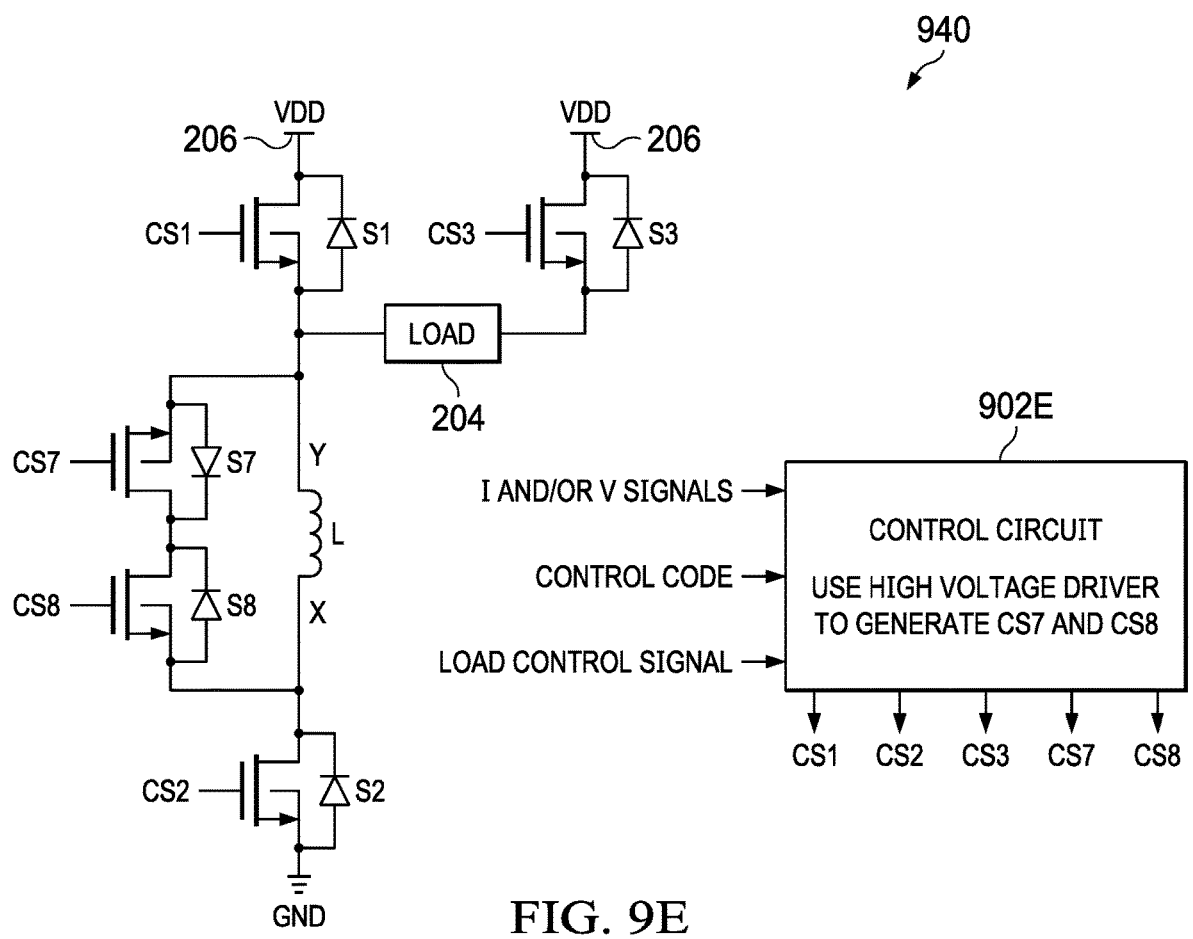
Figure 9F:
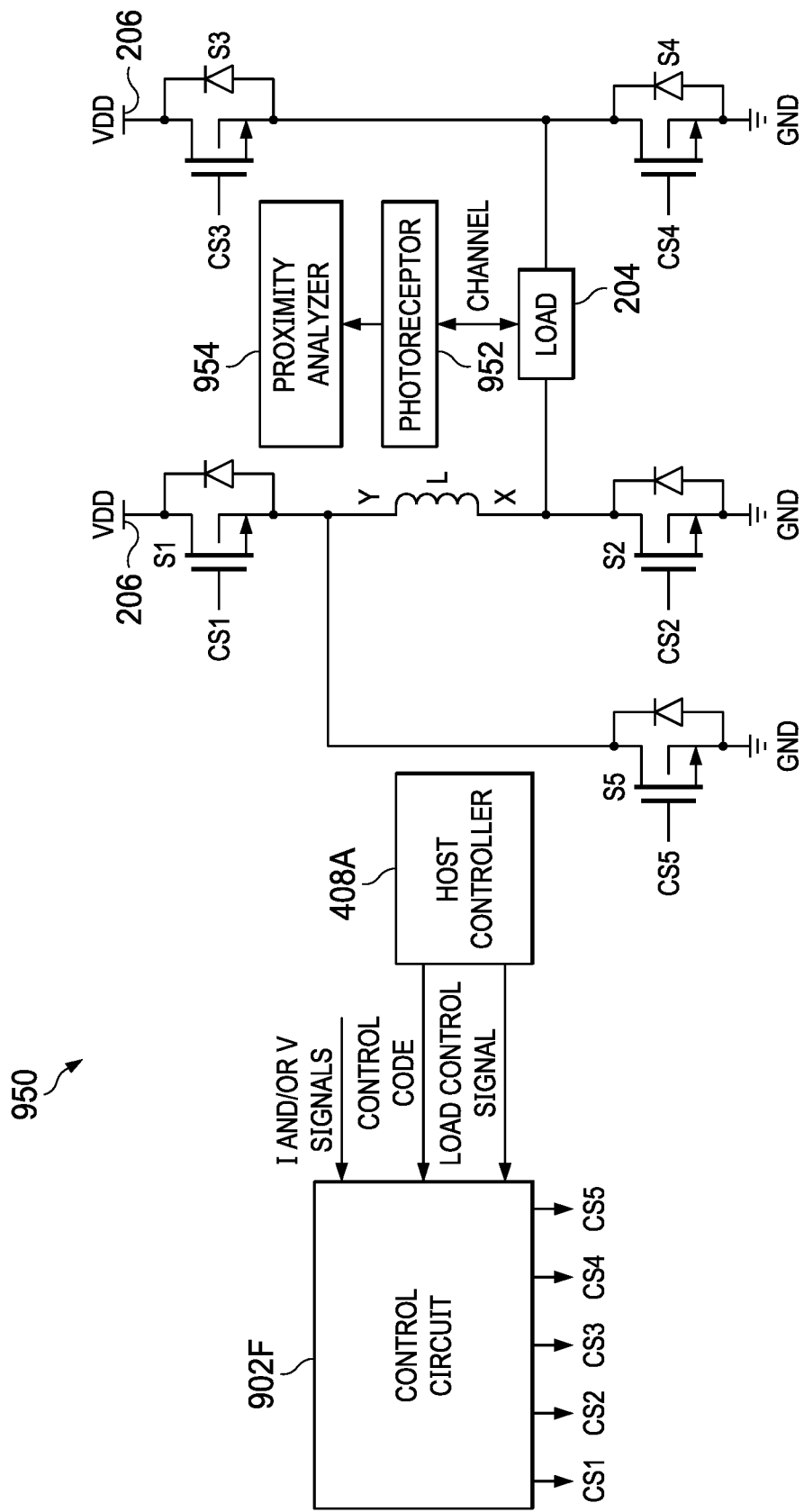
Figure 9G:
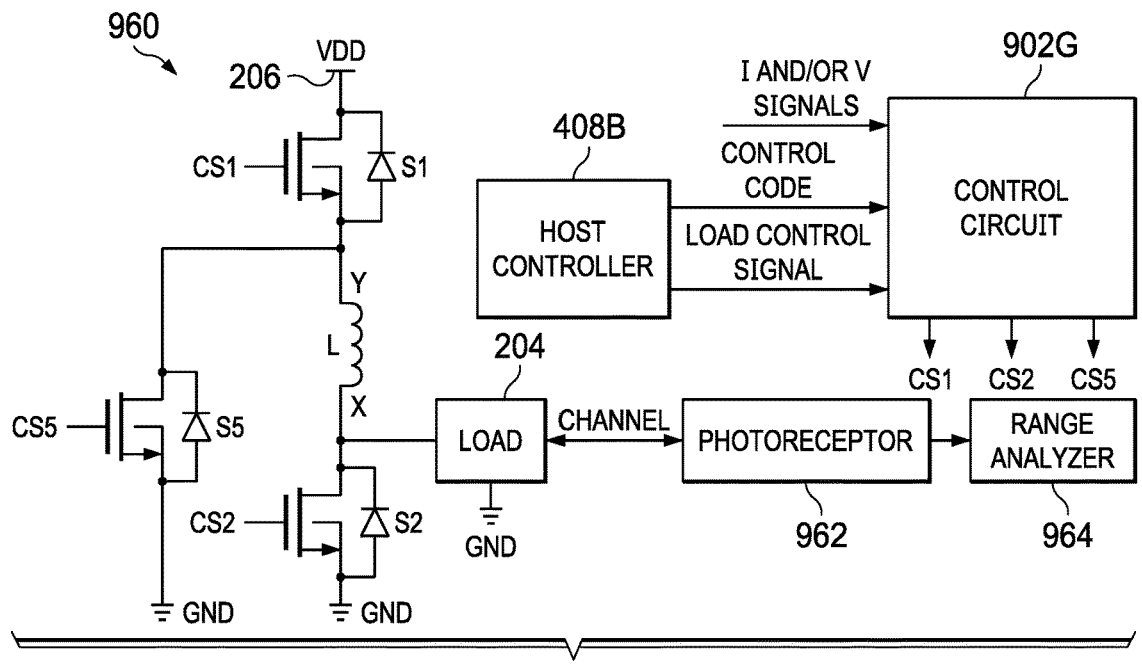

In FIG. 9G, the system 960 is related to a range sensor scenario, and additionally includes a host controller 408B (an example of the host controller 408 in FIG. 4), a photoceptor 962, and a proximity analyzer 964. The photoreceptor 962 is configured to provide a current in response to reflections of light emitted by the load 204 (e.g., based to the control code and load control signal provided by the host controller 408B). The range analyzer 964 (e.g., an analog circuit and/or digital circuit configured to analyze the current from the photoreceptor 962 as well as ToF information) is coupled to the photoreceptor 962 and is configured to determine a range value or result for the system 960. The results from the range analyzer 964 are provided to the host controller 408B or other control circuitry of the system 960 (e.g., to trigger system operations based on range results).

In some example embodiments, inductive current DAC components in FIGS. 9A-9G are part of an IC. As another option, inductor L may be a discrete component coupled to an IC that includes the other inductive current DAC components as well as IC terminals adapted to be coupled to inductor L, the load 204, a power supply, ground, and a controller configured to provide a control code.

In FIG. 9A, the inductive current DAC includes the power supply input 206, a ground connection, inductor L, and switches S1, S2 and S4 similar to the topology of the inductive current DAC in FIG. 3. In contrast to the inductive current DAC in FIG. 3 (with S5 between the Y side of inductor L and ground), the inductive current DAC in FIG. 9A includes two switches S7 (e.g., an nMOS device or other equivalent device) and S8 (e.g., an nMOS device or other equivalent device) in series between the Y side of inductor L and the X side of inductor L. Also, in the example of FIG. 9A, the control circuit 902A may include the same or similar components as the control circuit 302 in FIG. 3, except the control circuit 902A is configured to provide controls signals CS1, CS2, CS4, CS7, and CS8 to operate in ϕ1, ϕ2a, and/or ϕ3 modes of operation, as desired. For the ϕ1 mode of operation, the control circuit 902A is configured to assert CS1 and CS2 to turn on switches S1 and S2, while CS4, CS7, and CS8 are de-asserted to turn off switches S4, S7, and S8. If the load 204 is an LED, a laser diode, or other load that needs a threshold voltage to conduct current, CS4 can be asserted (e.g., turned on/cause to conduct) for the ϕ1 mode of operation. As another option, one or both sides of the load 204 may be uncoupled from the rest of the circuit during the ϕ1 mode of operation. For the ϕ2a mode of operation, the control circuit 902A is configured to assert CS1 and CS4 to turn on switches S1 and S4, while CS2, CS7, and CS8 are de-asserted to turn off switches S2, S7, and S8. For the ϕ3 mode of operation, the control circuit 902A is configured to assert CS7 and CS8 to turn on switches S7 and S8, while CS1, CS2, and CS4 are de-asserted to turn off switches S1, S2, and S4. As another option, the control circuit 902A may be configured to assert CS4/CS1, CS1, or CS2 along with CS7 and CS8 for the ϕ3 mode of operation. In some example embodiments, the control circuit 902A may use a high-voltage driver to generate CS7 and CS8. Compared to the topology of the inductive current DAC of FIG. 3, the inductive current DAC of FIG. 9A has more switches and thus more complex control circuitry. In an alternative topology, switches S7 and S8 of the inductive current DAC of FIG. 9A are replaced by switch S5 coupled between the Y side of inductor L and ground (as in the inductive current DAC of FIG. 3). In FIG. 9B, the inductive current DAC includes the power supply input 206, a ground connection, inductor L, and switches S1 and S2 similar to the topology of the inductive current DAC of FIG. 3. In contrast to the inductive current DAC in FIG. 3 (with switch S5 between the Y side of inductor L and ground), the inductive current DAC of FIG. 9B includes two switches S7 and S8 in series between the Y side of inductor L and the X side of inductor L. Also, switch S4 in the inductive current DAC of FIG. 3 is replaced by a high-side switch (S3) (e.g., an nMOS device or other equivalent device) in FIG. 9B, where switch S3 is between a second side of the load 204 and the power supply input 206. In the example of FIG. 9B, the control circuit 902B may include the same or similar components as the control circuit 302 in FIG. 3, except the control circuit 902B of FIG. 9B is configured to provide controls signals CS1, CS2, CS3, CS7, and CS8 to operate in the ϕ1, ϕ2a, and/or ϕ3 modes of operation, as desired. For the ϕ1 mode of operation, the control circuit 902B is configured to assert CS1 and CS2 to turn on switches S1 and S2, while CS3, CS7, and CS8 are de-asserted to turn off switches S3, S7, and S8. For the ϕ2a mode of operation, the control circuit 902B is configured to assert CS1 and CS3 to turn on switches S1 and S3, while CS2, CS7, and CS8 are de-asserted to turn off switches S2, S7, and S8. For the ϕ3 mode of operation, the control circuit 902B is configured to assert CS7 and CS8 to turn on switches S7 and S8, while CS1, CS2, and CS3 are de-asserted to turn off switches S1, S2, and S3. With the inductive current DAC topology of FIG. 9B, applications are limited to: loads configured to operate with a voltage greater than VDD (to allow $I_L$ to decrease); or loads that occasionally need current pulses (where the ϕ3 mode of operation is used to decrease $I_L$).

In some example embodiments, the control circuit 902B uses a high-voltage driver to generate CS7 and CS8. Compared to the topology of the inductive current DAC of FIG. 3, the inductive current DAC of FIG. 9B has more switches and thus more complex control circuitry. Also, the range of applications for the inductive current DAC of FIG. 9B is limited because $I_L$ decreases when switches S1 and S3 are turned on and there is no way to increase $I_L$ while delivering current through inductor L to the load 204. One example load compatible with the inductive current DAC of FIG. 9B is an LED and/or an array of LEDs. When the anode of the LED is coupled to node X and the cathode of the LED is coupled to the source terminal of switch S3, power can be delivered to the LED when CS1 and CS3 are asserted. Alternatively, S3 may be replaced by a short if the load has unidirectional current flow (e.g., if the load is a diode or LED). $I_L$ can be increased when CS1 and CS2 are asserted, and the energy in inductor L can be maintained when CS7, CS8, and CS2 are asserted. With an LED, the current load is discontinuous. If the switching frequency is high enough, the human eye acts as a filter to the LED light such that the end user won't notice the light flickering. In an alternative topology, switches S7 and S8 in the topology of FIG. 9B are replaced by switch S5 as in the topology of FIG. 3. In an alternative embodiment to the embodiment of FIG. 9B, an additional switch (such as switch S4) may be included in circuit 910. In such case, a corresponding control signal (such as CS4) would be generated by controller 902B. In some example embodiments, S3 is used as a current sense device. However, if the load 204 is a diode where the anode is connected to the X side of inductor L, S3 may be replaced with a short as long as an alternate current sensing method is used (e.g. measuring S1 or S2 current instead).

In FIG. 9C, the inductive current DAC includes the power supply input 206, ground connection, inductor L, and switches S1, S2 and S5 similar to the topology of the inductive current DAC of FIG. 3. In contrast to the inductive current DAC of FIG. 3 (with the load 204 between the X side of inductor L and ground via switch S4), the load 204 in FIG. 9C is coupled in parallel with inductor L. Also, the control circuit 902C in FIG. 9C may include the same or similar components as the control circuit 302 in FIG. 3, except the control circuit 902C is configured to provide controls signals CS1, CS2, and CS5 to operation in the ϕ1, ϕ2b, and/or ϕ3 modes of operation, as desired. For the ϕ1 mode of operation, the control circuit 902C is configured to assert CS1 and CS2 to turn on switches S1 and S2, while CS5 is de-asserted to turn off switch S5. In the topology of FIG. 9C, the load 204 has the ability to block current in one direction (e.g. LED, VCSEL) to prevent conduction when CS1 and CS2 are asserted. For example, if the load 204 is a diode, the anode would be coupled to the X side of inductor L, while the cathode of inductor L is coupled to the Y side of inductor L. For the ϕ2b mode of operation, the control circuit 902C is configured to assert CS5 to turn on switch S5, while CS1 and CS2 are de-asserted to turn off switches S1 and S2. For the ϕ3 mode of operation, the control circuit 902C is configured to assert CS2 and CS5 to turn on switches S2 and S5, while CS1 is de-asserted to turn off switch S1.

Compared to the topology of the inductive current DAC of FIG. 3, the inductive current DAC of FIG. 9C has fewer switches and thus more simple control circuitry. However, with the inductive current DAC of FIG. 9C, energy delivery to the load 204 demagnetizes inductor L and there is no way of increasing $I_L$ while delivering power to load. This limits the range of applications for the inductive current DAC of FIG. 9C. One example load compatible with the inductive current DAC of FIG. 9C is an LED and/or an LED array. When the anode of the LED is coupled to the X side of inductor L and the cathode of the LED is coupled to the Y side of inductor L, power can be delivered to the LED from inductor L. $I_L$ can be increased when CS1 and CS2 are asserted. In this case, the load is reverse biased and does not conduct. Inductor L can be slowly demagnetized via switches S2 and S5. With an LED, the current load is discontinuous. If the switching frequency is high enough, the human eye acts as a filter to the LED light such that the end user won't notice the light flickering. In an alternative topology, switch S5 is replaced by switches S7 and S8 between the Y side of inductor L and the X side of inductor L (as in the examples of FIGS. 9A and 9B).

In FIG. 9D, the inductive current DAC includes the power supply input 206, ground connection, inductor L, and switches S1, S2 and S4 similar to the topology of the inductive current DAC of FIG. 3. In contrast to the inductive current DAC in FIG. 3 (with switch S5 between the Y side of inductor L and ground, and with the load 204 between the X side of inductor L and ground via switch S4), the inductive current DAC of FIG. 9D includes two switches S7 and S8 in series between the Y side of L and the X side of inductor L. Also, the load 204 is between the Y side of inductor L and ground via switch S4. The control circuit 902D may include the same or similar components as the control circuit 302 in FIG. 3, except the control circuit 902D is configured to provide controls signals CS1, CS2, CS4, CS7, and CS8 to operation in the φ1, φ2b, and/or φ3 modes of operation, as desired. For the φ1 mode of operation, the control circuit 902D is configured to assert CS1 and CS2 to turn on switches S1 and S2, while CS4, CS7, and CS8 are de-asserted to turn off switches S4, S7, and S8. In some example embodiments, S4 may be replaced by a short if the load 204 blocks current when the voltage at the Y side of inductor L is higher than GND (e.g. a diode whose anode is coupled to ground and whose cathode is coupled to the Y terminal of inductor L).

For the φ2b mode of operation, the control circuit 902D is configured to assert CS2 and CS4 to turn on switches S2 and S4, while CS1, CS7, and CS8 are de-asserted to turn off switches S1, S7, and S8. For the φ3 mode of operation, the control circuit 902D is configured to assert CS7 and CS8 to turn on switches S7 and S8, while CS1, CS2, and CS4 are de-asserted to turn off switches S1, S2, and S4. As another option, the control circuit 902D may be configured to assert CS1, CS2 or CS2/CS4 along with CS7 and CS8 during the φ3 mode of operation.

Compared to the topology of the inductive current DAC of FIG. 3, the voltage at the Y side of inductor L goes negative when delivering power to the load 204 due to the load 204 being coupled to the Y side of inductor L rather than the X side of inductor L. Thus, energy delivery to the load 204 using the inductive current DAC of FIG. 9D demagnetizes inductor L and there is no way of increasing $I_L$ while delivering power to the load 204. This limits the range of applications for the inductive current DAC of FIG. 9D. One example load compatible with the inductive current DAC of FIG. 9D is an LED and/or an array of LEDs. When the anode of the LED is coupled to the drain terminal of S4 and the cathode of the LED is coupled to the Y side of inductor L, power can be delivered to the LED when CS2 and CS4 are asserted and there is energy in inductor L. $I_L$ can be increased when CS1 and CS2 are asserted. In this case, the load 204 is reverse biased and not conducting. Also, inductor L can be slowly demagnetized via switches S5 and S2. With an LED, the current load is discontinuous. Again, if the switching frequency is high enough, the human eye acts as a filter to the LED light such that the end user won't notice the light flickering. In an alternative topology, switches S7 and S8 are replaced by switch S5 coupled between the Y side of inductor L and ground (as in the example of FIG. 3).

In FIG. 9E, the inductive current DAC includes the power supply input 206, inductor L, and switches S1, S2 and S3 similar to the topology of the inductive current DAC of FIG. 3. In contrast to the inductive current DAC of FIG. 3 (with switch S5 between the Y side of inductor L and ground, and with the load 204 between the X side of inductor L and ground via switch S4), the inductive current DAC of FIG. 9E includes two switches S7 and S8 in series between the Y side of inductor L and the X side of inductor L. Also, the load 204 is between the Y side of inductor L and the power supply input 206 via S3. The control circuit 902E may include the same or similar components as the control circuit 302 in FIG. 3, except the control circuit 902E is configured to provide controls signals CS1, CS2, CS3, CS7, and CS8 to operate in the φ1, φ2a, and/or φ3 modes of operation, as desired. For the φ1 mode of operation, the control circuit 902E is configured to assert CS1 and CS2 to turn on switches S1 and S2, while CS3, CS7, and CS8 are de-asserted to turn off switches S3, S7, and S8. For the φ2a mode of operation, the control circuit 902E is configured to assert CS1 and CS3 to turn on switches S1 and S3, while CS3, CS7, and CS8 are de-asserted to turn off switches S3, S7, and S8. For the φ3 mode of operation, the control circuit 902E is configured to assert CS7 and CS8 to turn on switches S7 and S8, while CS1, CS2, and CS3 are de-asserted to turn off switches S1, S2, and S3. As another option, the control circuit 902E may be configured to assert CS7 and CS8 along with CS1, CS2, CD3, or CS1/CS3 for the φ3 mode of operation.

Compared to the topology of the inductive current DAC of FIG. 3, energy delivery to the load 204 using the inductive current DAC of FIG. 9E demagnetizes inductor L and there is no way of increasing $I_L$ while delivering power to the load 204. This limits the range of applications for the inductive current DAC of FIG. 9E. One example load compatible with the inductive current DAC of FIG. 9E is an LED. When the anode of the LED is coupled to the source terminal of switch S3 and the cathode of the LED is coupled to Y side of inductor L, power can be delivered to the LED when CS2 and CS3 are asserted and there is energy in the inductor. $I_L$ can be increased (e.g., using the φ1 mode of operation) when CS1 and CS2 are asserted. Inductor L can be slowly demagnetized via switches S7 and S8. With an LED, the current load is discontinuous. Again, if the switching frequency is high enough, the human eye acts as a filter to the LED light such that the end user won't notice the light flickering. In an alternative topology, switches S7 and S8 are replaced by switch S5 coupled between the Y side of inductor L and ground (as in the example of FIG. 3).

In FIG. 9F, the inductive current DAC includes the power supply input 206, inductor L, and switches S1, S2, S4 and S5 similar to the topology of the inductive current DAC of FIG. 3. In contrast to the inductive current DAC of FIG. 3, the inductive current DAC of FIG. 9F includes another switch (S3) between the second side of the load 204 and the power supply input 206. Also, the control circuit 902F may include the same or similar components as the control circuit 302 in FIG. 3, except the control circuit 902F is configured to provide controls signals CS1, CS2, CS3, CS4, and CS5 to operate in the φ1, φ2a, φ2b, φ3 and/or φ4 modes of operation, as desired. For the φ1 mode of operation, the control circuit 902F is configured to assert CS1 and CS2 to turn on switches S1 and S2, while CS3, CS4, and CS5 are de-asserted to turn off switches S3, S4, and S5. For the φ2a mode of operation, the control circuit 902F is configured to assert CS1 and CS4 to turn on switches S1 and S4, while CS2, CS3, and CS5 are de-asserted to turn off switches S2, S3, and S5. For the φ2b mode of operation, the control circuit 902F is configured to assert CS4 and CS5 to turn on switches S4 and S5, while CS1, CS2, and CS3 are de-asserted to turn off switches S1, S2, and S3. For the φ3 mode of operation, the control circuit 902F is configured to assert CS2 and CS5 to turn on switches S2 and S5, while CS1, CS3, and CS4 are de-asserted to turn off switches S1, S3, and S4. For the φ4 mode of operation, the control circuit 902F is configured to assert CS1 and CS3 to turn on switches S1 and S3, while CS2, CS4, and CS5 are de-asserted to turn off switches S2, S4, and S5. Compared to the topology of the inductive current DAC of FIG. 3, the inductive current DAC of FIG. 9F has more switches, more complex control circuitry, and more dV/dt flexibility. In an alternative topology, switch S5 is replaced by switches S7 and S8 between the Y side of inductor L and the X side of inductor L (as in the examples of FIGS. 9A and 9B).

In FIG. 9G, the inductive current DAC includes the power supply input 206, inductor L, and switches S1, S2 and S5 similar to the topology of the inductive current DAC of FIG. 3. In contrast to the inductive current DAC of FIG. 3, the inductive current DAC of FIG. 9G omits switch S4 (the second side of the load 204 is still coupled to ground). Also, the control circuit 902G may include the same or similar components as the control circuit 302 in FIG. 3, except the control circuit 902F is configured to provide controls signals CS1, CS2, and CS5 to operate in the φ1, φ2a, φ2b, and/or φ3 modes of operation, as desired. For the φ1 mode of operation, the control circuit 902G is configured to assert CS1 and CS2 to turn on switches S1 and S2, while CS5 are de-asserted to turn off switch S5. In some example embodiments, one or both sides of the load 204 may be uncoupled from the rest of the circuit during the φ1 mode of operation. For the φ2a mode of operation, the control circuit 902G is configured to assert CS1 to turn on switch S1, while CS2 and CS5 are de-asserted to turn off switches S2 and S5. For the φ2b mode of operation, the control circuit 902G is configured to assert CS5 to turn on switch S5, while CS1 and CS2 are de-asserted to turn off switches S1 and S2. For the φ3 mode of operation, the control circuit 902G is configured to assert CS2 and CS5 to turn on switches S2 and S5, while CS1 is de-asserted to turn off switches S1. Compared to the topology of the inductive current DAC of FIG. 3, the inductive current DAC of FIG. 9G has fewer switches and less complex control circuitry by omitting a safety switch (e.g., switch S4). As desired, switch S4 could be omitted from other inductive current DAC topologies provided that a small amount of voltage drop across switch S2 does not cause current flow through the load during the φ3 mode of operation.

Figure 10:
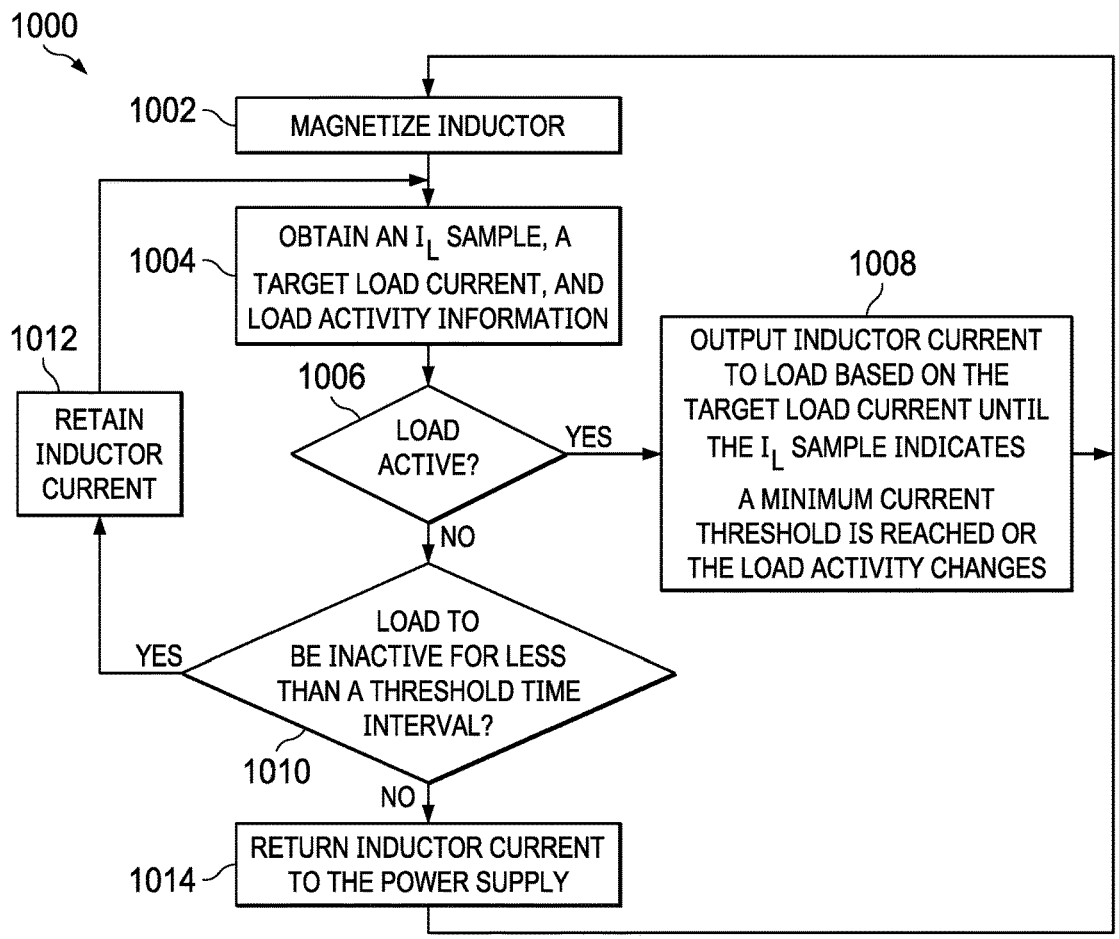
FIG. 10 is a flowchart of an inductive current DAC method in accordance with an example embodiment.

FIG. 10 is a flowchart of a inductive current DAC method 1000 in accordance with an example embodiment. In FIG. 10, an inductor of the inductive current DAC method 1000 is magnetized at block 1002 (e.g., φ1 mode of operation is performed). In different example embodiments, block 1002 may be performed in response to a load control signal, a schedule, or other criteria. At block 1004, an $I_L$ sample (e.g., indicated by a sense signal) (and/or the inductor current is sensed), a target load current (e.g., indicated by the control code), and load activity information (e.g., indicated by a load control signal) are obtained. If the load is active (determination block 1006), $I_L$ is output to the load based on the target load current until the $I_L$ sample indicates a minimum current threshold is reached or the load activity changes at block 1008 (e.g., the φ2b mode of operation is used while the load is active). In some example embodiments, block 1008 may include an option to alternate between a first output phase (e.g., the φ2a mode of operation) and a second output phase (e.g., the φ2b mode of operation). In such embodiments, the method 1000 stays at block 1008 by alternating between the first output phase and the second output phase until the load activity changes (e.g., the load is turned off). After block 1008, the method 1000 returns to block 1002 or a waiting state (e.g., waiting for a load control signal, a schedule, or other criteria to trigger block 1002 again). If the load is not active (determination block 1002) and the inductor was previously magnetized, the method 1000 may include determining whether the load is to be inactive for less than a threshold time interval (determination block 1010). If so, $I_L$ is retained at block 1012 (e.g., using the φ3 mode of operation), and the method 1000 returns to block 1004. If the load is to be inactive for the threshold time interval or more (determination block 1010), $I_L$ may be returned to the power supply at block 1014 (e.g., using the φ4 mode of operation) and the method 1000 returns to block 1002. In some example embodiments, inductive current DAC control operations are performed without load activity information (e.g., an $I_L$ sample and/or resulting ILIM events may still be used).

In some example embodiments, an inductive current DAC includes: a power supply input (e.g., the power supply input 206 in FIGS. 3, 4, and 9A-9G); an output (e.g., the Y side of inductor L, the X side of inductor L, or a related terminal) adapted to be coupled to a load (e.g., the load 204 in FIGS. 3, 4, and 9A-9G); an inductor (e.g., inductor L in FIGS. 3, 4, and 9A-9G) between the power supply input and the load; and inductor current control circuitry (e.g., each respective set of switches and related control circuit in FIGS. 3, 4, and 9A-9G) coupled to the inductor and having: a sense signal input (e.g., the first control circuit input 338 in FIG. 3, or similar control circuit inputs in FIGS. 4 and 9A-9G) configured to receive a sense signal (e.g., current and/or voltage signals); a control code input (e.g., the second control circuit input 340 in FIG. 3, or similar control circuit inputs in FIGS. 4 and 9A-9G) configured to receive a control code; a set of switches (e.g., each respective set of switches in FIGS. 3, 4, and 9A-9G) having respective control terminals; and a set of control circuit outputs (e.g., the control circuits outputs 342, 344, 346, and 348 in FIG. 3, or similar control circuit outputs in FIGS. 4 and 9A-9G) coupled to the respective control terminals of the set of switches. The inductor current control circuitry is configured to adjust control signals provided to the set of control circuit outputs based on the sense signal and the control code.

In some example embodiments, the inductor current control circuitry includes: a phase selection circuit (e.g., the phase selection circuit 318 in FIG. 3) having a phase selection circuit input (e.g., the phase selection circuit input 320 in FIG. 3) and a phase selection circuit output (e.g., the phase selection circuit output 324 in FIG. 3), the phase selection circuit input configured to receive a current limit signal (e.g., comparison results or ILIM indicators in FIG. 3), and the phase selection circuit configured to provide a phase control signal at the phase selection circuit output based on the current limit signal; and a driver circuit (e.g., the driver circuit 326 in FIG. 3) having a driver circuit input (e.g., the driver circuit input 328 in FIG. 3) and driver circuit outputs (e.g., the driver circuit outputs 330, 332, 334, and 336 in FIG. 3), the driver circuit input is coupled to the phase selection circuit output, the driver circuit outputs are coupled to the set of control circuit outputs, and the driver circuit is configured to provide switch control signals to driver circuit outputs based on the phase control signal.

In some example embodiments, the phase selection circuit input is a first phase selection circuit input, the phase selection circuit includes a second phase selection circuit input (e.g., the second phase selection circuit input 322 in FIG. 3) configured to receive load activity information, and the phase selection circuit is configured to provide the phase control signal at the phase selection circuit output based on the current limit signal and the load activity information. In some example embodiments, the inductor current control circuitry includes: sense circuitry (e.g., the sense circuit 304 in FIG. 3) having a sense circuitry input (e.g., the sense circuitry input 306 in FIG. 3) and a sense circuitry output (e.g., the sense circuitry output 308 in FIG. 3). The sense circuitry input is coupled to the sense signal input. The sense circuitry is configured to provide an inductor current sample at the sense circuitry output based on the sense signal; and comparison circuitry (e.g., the comparison circuitry 310 in FIG. 3) having a comparison circuitry input (e.g., the first comparison circuitry input 312 in FIG. 3) and a comparison circuitry output (e.g., the comparison circuitry output 316 in FIG. 3). The comparison circuitry input is coupled to the sense circuitry output. The comparison circuitry output is coupled to the phase selection circuit input. The comparison circuitry is configured to provide the current limit signal to the comparison circuitry output based on a comparison of the inductor current sample with a maximum current threshold (e.g., $I_{max}$ in FIGS. 3 and 5) and a minimum current threshold (e.g., $I_{min}$ in FIGS. 3 and 5).

In some example embodiments, the comparison circuitry input is a first comparison circuitry input, the comparison circuitry includes a second comparison circuitry input (e.g., the second comparison circuitry inputs 314 in FIG. 3), the inductor current control circuitry includes control logic (e.g., the control logic 309 in FIG. 3) having a control logic input (e.g., the control logic input 311 in FIG. 3) and a control logic output (e.g., the control logic output 313 in FIG. 3). The control logic input is coupled to the control code input. The control logic output is coupled to the second comparison circuitry input. The control logic is configured to adjust the maximum current threshold and the minimum current threshold based on the control code.

In some example embodiments, the set of switches include: a first switch (e.g., switch S1 in FIGS. 3, 4, and 9A-9G) between the power supply input and a first side of the inductor; and a second switch (e.g., switch S2 in FIGS. 3, 4, and 9A-9G) between a second side of the inductor and ground. In some example embodiments, the set of switches include a third switch (e.g., switch S5 in FIGS. 3, 4, and 9C, 9F and 9G) between the first side of the inductor and ground. In some example embodiments, the set of switches include a third switch and a fourth switch (e.g., switches S7 and S8 in FIGS. 9A, 9B, 9D, and 9E) in series between the first side of the inductor and the second side of the inductor.

In some example embodiments, a first side of the load is coupled to a second side of the inductor (e.g., the X side of inductor L in FIGS. 3, 4, 9A, and 9F), and the set of switches include a third switch (e.g., switch S4 in FIGS. 3, 4, 9A, and 9F) between a second side of the load and ground. In some example embodiments, a first side of the load is coupled to a first side of the inductor (e.g., the Y side of inductor L in FIG. 9D), and the set of switches include a third switch (e.g., switch S4 in FIG. 9D) between a second side of the load and ground. In some example embodiments, a first side of the load is coupled to a first side of the inductor (e.g., the Y side of inductor L in FIG. 9E), and the set of switches include a third switch (e.g., switch S3 in FIG. 9E) between a second side of the load and the power supply input. In some example embodiments, the set of switches includes a third switch (e.g., switch S3 in FIG. 9B) between the second side of the inductor (e.g., the X side of inductor L in FIG. 9B) and the power supply input.

In some example embodiments, a system (e.g., the systems 300, 400, 900, 910, 920, 930, 940, 950, and 960 in FIGS. 3, 4, and 9A-9G) includes a power supply input (e.g., the power supply that provided VDD to the power supply input 206 in FIGS. 3, 4, and 9A-9G); a load (e.g., the load 204 in FIGS. 3, 4, and 9A-9G); and an inductive current DAC (e.g., the inductive current DACs in FIGS. 3, 4, and 9A-9G) coupled to the power supply and the load, wherein the inductive current DAC has an inductor (e.g., inductor L in FIGS. 3, 4, and 9A-9G), a set of switches (e.g., the respective switches of FIGS. 3, 4, and 9A-9G), and a control circuit (e.g., the respective control circuits 302, 402, 902A-902G in FIGS. 3, 4, and 9A-9G). The control circuit is configured to adjust control signals (e.g., respective sets of CS1, CS2, CS3, CS4, CS5, CS6, CS7, or CS8 in FIGS. 3, 4, and 9A-9G) for the set of switches to operate the inductive current DAC in different phases.

In some example embodiments, control circuit is configured to adjust the control signals for the set of switches to operate the inductive current DAC in a magnetization phase (e.g., the φ1 mode of operation herein) in which inductor current increases and current is not provided to the load. In some example embodiments, the control circuit is configured to adjust the control signals for the set of switches to operate the inductive current DAC in a first output phase (e.g., the φ2a mode of operation herein) in which the inductor and the load are coupled in series between the power supply and ground. In some example embodiments, the control circuit is configured to adjust the control signals for the set of switches to operate the inductive current DAC in a second output phase (e.g., the φ2b mode of operation herein) in which the inductor and the load are coupled in series between ground. In some example embodiments, the control circuit is configured to adjust the control signals for the set of switches to operate the inductive current DAC in an energy storage phase (e.g., the φ3 mode of operation herein) in which inductor current stays in the inductor. In some example embodiments, the control circuit is configured to adjust the control signals for the set of switches to operate the inductive current DAC in an energy return phase (e.g., the φ4 mode of operation herein) in which inductor current is returned to the power supply. In some example embodiments, the load is an LED. In other example embodiments, the load is a VCSEL.

In some example embodiments, an inductive current DAC circuit includes: a power supply input (e.g., power supply input 206 in FIG. 3) adapted to be coupled to a power supply (e.g., the power supply 301 in FIG. 3); a first load terminal (e.g., the first load terminal 205 in FIG. 3) adapted to be coupled to a first side of a load (e.g., the load 204 in FIG. 3); a second load terminal (e.g., the second load terminal 207 in FIG. 3) adapted to be coupled to a second side of the load; a first inductor terminal (e.g., the Y side of inductor L in FIG. 3) coupled to the power supply input, the first inductor terminal adapted to be coupled to a first side of an inductor (e.g., inductor L in FIG. 3); a second inductor terminal (e.g., the X side of inductor L in FIG. 3) adapted to be coupled to a second side of the inductor; a first field-effect transistor (FET) (e.g., S1 in FIG. 3) having a first current terminal, a second current terminal and a first control terminal, the first current terminal of the first FET coupled to the power supply input, and the second current terminal of the first FET coupled to the first inductor terminal; a second FET (e.g., S2 in FIG. 3) having a first current terminal, a second current terminal and a second control terminal, the first current terminal of the second FET coupled to the second inductor terminal, and the second current terminal of the second FET coupled to ground; a third FET (e.g., S4 in FIG. 3) having a first current terminal, a second current terminal and a third control terminal, the first current terminal of the third FET coupled to the second load terminal, and the second current terminal of the third FET coupled to ground; and a fourth FET (e.g., S5 in FIG. 3) having a first current terminal, a second current terminal and a fourth control terminal, the first current terminal of the fourth FET coupled to the first inductor terminal, and the second current terminal of the fourth FET coupled to ground.

The inductive current DAC also includes a control circuit (e.g., the control circuit 302 in FIG. 3) coupled to the first control terminal, the second control terminal, the third control terminal and the fourth control terminal, wherein the control circuit is configured to provide selectively provide control signals to the first control terminal, the second control terminal, the third control terminal, and the fourth control terminal to support different phases of the inductive current DAC.

In some example embodiments, the inductor is operable to conduct an inductor current, and the control circuit includes: sense circuitry (e.g., the sense circuitry 304 in FIG. 3) configured to receive a sense signal representative of the inductor current and to provide an inductor current sample (e.g., $I_L$ sample in FIG. 3) based on the sense signal; comparison circuitry (e.g., the comparison circuitry 310 in FIG. 3) configured to compare the sense signal sample to a maximum inductor current threshold and a minimum inductor current threshold; phase selection circuitry (e.g., the phase selection circuitry 318 in FIG. 3) configured select a phase based on result of the comparison performed by the comparison circuitry; and driver circuitry (e.g., the driver circuitry 326 in FIG. 3) configured to provide the control signals based on the selected phase.

In some example embodiments, the control circuit is configured to: receive a control code (e.g., at the second control circuit input 340 in FIG. 3); and adjust the maximum inductor current threshold (e.g., $I_{max}$ or a related voltage) and a minimum inductor current threshold (e.g., $I_{min}$ or a related voltage) based on the control code. The control circuit is configured to: receive a load control signal (e.g., at the third control circuit input 341 in FIG. 3); and adjust the phase based on the load control signal. In some example embodiments, the control circuit is configured to support a magnetization phase, a first output phase, a second output phase and an energy storage phase of the inductive current DAC. The magnetization phase is based on the control circuit providing control signals to turn on the first and second FETs and to turn off the third and fourth FETs. The first output phase is based on the control circuit providing control signals to turn on the first and third FETs and to turn off the second and fourth FETs. The second output phase based on the control circuit providing control signals to turn on the third and fourth FETs and to turn off the first and second FETs, and the energy storage phase based on the control circuit providing control signals to turn on the second and fourth FETs and to turn off the first and third FETs.

In some example embodiments, the load is an optical transmitter load (e.g., related to the system 400 in FIG. 4). In such case, the control circuit is configured to: receive a load control signal and a control code related to the optical transmitter load; and adjust timing of the different phases of the inductive current DAC based on the load control signal and the control code related to the optical transmitter load. In some example embodiments, the load is a proximity sensor load (e.g., related to the system 950 in FIG. 9F). In such case, the control circuit is configured to: receive a load control signal and a control code related to the proximity sensor load; and adjust timing of the different phases of the inductive current DAC based on the load control signal and the control code related to the proximity sensor load. In some example embodiments, the load is a range sensor load (e.g., related to the system 950 in FIG. 9F). In such case, the control circuit is configured to: receive a load control signal and a control code related to the range sensor load; and adjust timing of the different phases of the inductive current DAC based on the load control signal and the control code related to the range sensor load.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

As used herein, the terms "terminal", "electrode," "node," "interconnection," "pin," "contact," and "connecter" are used interchangeably. Unless specifically stated to the contrary, these terms are generally used to mean an interconnection between or a terminus of a device element, a circuit element, an integrated circuit, a device or other electronics or semiconductor component.

While the use of particular transistors are described herein, other transistors (or equivalent devices) may be used instead with little or no change to the remaining circuitry. For example, a metal-oxide-silicon FET ("MOSFET") (such as an n-channel MOSFET, nMOSFET, or a p-channel MOSFET, pMOSFET), a bipolar junction transistor (BJT—e.g. NPN or PNP), insulated gate bipolar transistors (IGBTs), and/or junction field effect transistor (JFET) may be used in place of or in conjunction with the devices disclosed herein. The transistors may be depletion mode devices, drain-extended devices, enhancement mode devices, natural transistors or other type of device structure transistors. Furthermore, the devices may be implemented in/over a silicon substrate (Si), a silicon carbide substrate (SiC), a gallium nitride substrate (GaN) or a gallium arsenide substrate (GaAs). Hence, when referring to a current electrode, such electrode may be an emitter, collector, source or drain. Also, the control electrode may be a base or a gate.

While some example embodiments suggest that certain elements are included in an integrated circuit while other elements are external to the integrated circuit, in other example embodiments, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

Uses of the phrase "ground" in this description include a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means +/−10 percent of the stated value.

Modifications are possible in the described embodiments, and other embodiments are possible, within the scope of the claims.

What is claimed is:

1. An inductive current digital-to-analog converter (DAC) comprising:
    an inductor having a first terminal and a second terminal;
    inductor current control circuitry having:
        a sense signal input;
        a control code input;
        a set of switches having respective control terminals; and
        a set of control circuit outputs coupled to the respective control terminals of the set of switches;
    a phase selection circuit having a phase selection circuit input and a phase selection circuit output; and
    a driver circuit having a driver circuit input and driver circuit outputs, the driver circuit input coupled to the phase selection circuit output, the driver circuit outputs coupled to the set of control circuit outputs.

2. The inductive current DAC of claim 1, wherein the phase selection circuit input is a first phase selection circuit input, the phase selection circuit includes a second phase selection circuit input configured to receive a load control signal.

3. The inductive current DAC of claim 1, wherein the inductor current control circuitry further includes:
    sense circuitry having a sense circuitry input and a sense circuitry output, the sense circuitry input coupled to the sense signal input; and
    comparison circuitry having a comparison circuitry input and a comparison circuitry output, the comparison circuitry input coupled to the sense circuitry output, the comparison circuitry output coupled to the phase selection circuit input.

4. The inductive current DAC of claim 3, wherein the comparison circuitry input is a first comparison circuitry input, the comparison circuitry includes a second comparison circuitry input, the inductor current control circuitry includes control logic having a control logic input and a control logic output, the control logic input coupled to the control code input and the control logic output coupled to the second comparison circuitry input.

5. The inductive current DAC of claim 1, wherein the set of switches include:
    a first switch adapted to be coupled to a power supply and the first terminal of the inductor; and
    a second switch coupled to a second terminal of the inductor and ground.

6. The inductive current DAC of claim 5, wherein the set of switches includes a third switch coupled to the first terminal of the inductor and ground.

7. The inductive current DAC of claim 5, wherein the set of switches includes a third switch and a fourth switch in series coupled to the first terminal of the inductor and the second terminal of the inductor.

8. The inductive current DAC of claim 5, wherein the set of switches includes a third switch coupled to the second terminal of the inductor and the power supply.

9. An inductive current digital-to-analog converter (DAC) circuit, comprising:
    an inductor having a first terminal and a second terminal;
    a first field-effect transistor (FET) having a first current terminal, a second current terminal and a first control terminal, the first current terminal of the first FET coupled to the the first terminal of the inductor, and the second current terminal of the first FET coupled to the second terminal of the inductor;
    a second FET having a first current terminal, a second current terminal and a second control terminal, the first current terminal of the second FET coupled to the second terminal of the inductor, and the second current terminal of the second FET coupled to ground;
    a third FET having a first current terminal, a second current terminal and a fourth control terminal, the first current terminal of the third FET coupled to the first terminal of the inductor, and the second current terminal of the third FET coupled to ground; and
    a control circuit coupled to the first control terminal, the second control terminal, and the third control terminal, wherein the control circuit is configured to provide selectively provide control signals to the first control terminal, the second control terminal, and the third control terminal to support different phases of the inductive current DAC.

10. The inductive current DAC circuit of claim 9, wherein the inductor is operable to conduct an inductor current, and the control circuit includes:

sense circuitry configured to receive a sense signal representative of the inductor current and to provide an inductor current sample based on the sense signal;

comparison circuitry configured to compare the sense signal sample to a maximum inductor current threshold and a minimum inductor current threshold;

phase selection circuitry configured select a phase based on result of the comparison performed by the comparison circuitry; and driver circuitry configured to provide the control signals based on the selected phase.

11. The inductive current DAC circuit of claim 10, wherein the control circuit is configured to:

receive a control code; and adjust the maximum inductor current threshold and a minimum inductor current threshold based on the control code.

12. The inductive current DAC circuit of claim 10, wherein the control circuit is configured to:

receive a load control signal; and adjust the phase based on the load control signal.

13. The inductive current DAC circuit of claim 9, wherein the control circuit is configured to support a magnetization phase, a first output phase, a second output phase and an energy storage phase of the inductive current DAC, the magnetization phase based on the control circuit providing control signals to turn on the first and second FETs and to turn off the third FETs, the first output phase based on the control circuit providing control signals to turn on the first FET and to turn off the second and third FETs, the second output phase based on the control circuit providing control signals to turn on the third FET and to turn off the first and second FETs, and the energy storage phase based on the control circuit providing control signals to turn on the second and third FETs and to turn off the first FET.

14. The inductive current DAC circuit of claim 9, wherein the load is an optical transmitter load, and the control circuit is configured to:

receive a load control signal and a control code related to the optical transmitter load; and adjust timing of the different phases of the inductive current DAC based on the load control signal and the control code related to the optical transmitter load.

15. The inductive current DAC circuit of claim 9, wherein the load is a proximity sensor load, and the control circuit is configured to:

receive a load control signal and a control code related to the proximity sensor load; and adjust timing of the different phases of the inductive current DAC based on the load control signal and the control code related to the proximity sensor load.

16. The inductive current DAC circuit of claim 9, wherein the load is a range sensor load, and the control circuit is configured to:

receive a load control signal and a control code related to the range sensor load; and adjust timing of the different phases of the inductive current DAC based on the load control signal and the control code related to the range sensor load.

* * * * *